(12) United States Patent
Luo et al.

(10) Patent No.: US 10,333,567 B1
(45) Date of Patent: Jun. 25, 2019

(54) WIRELESS DEVICES AND SYSTEMS INCLUDING EXAMPLES OF COMPENSATING POWER AMPLIFIER NOISE

(71) Applicant: MICRON TECHNOLOGY, INC., Boise, ID (US)

(72) Inventors: Fa-Long Luo, San Jose, CA (US); Jeremy Chritz, Seattle, WA (US); Jaime Cummins, Bainbridge Island, WA (US); Tamara Schmitz, Scotts Valley, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/118,017

(22) Filed: Aug. 30, 2018

Related U.S. Application Data

(63) Continuation of application No. 15/986,555, filed on May 22, 2018.

(51) Int. Cl.
*H04B 1/04* (2006.01)
*H04L 1/00* (2006.01)
(Continued)

(52) U.S. Cl.
CPC ........ *H04B 1/0475* (2013.01); *H03M 13/156* (2013.01); *H04B 1/0483* (2013.01);
(Continued)

(58) Field of Classification Search
CPC .. H04B 1/0064; H04B 1/0483; H04B 1/0475; H04B 2001/0425; H03F 1/3247;
(Continued)

(56) References Cited

U.S. PATENT DOCUMENTS

| 8,699,620 B1 * | 4/2014 | Wu ......................... H04N 7/52 375/254 |
| 2004/0246048 A1 * | 12/2004 | Leyonhjelm .......... H03F 1/3247 330/2 |

(Continued)

OTHER PUBLICATIONS

U.S. Appl. No. 15/986,555, titled "Wireless Devices and Systems Including Examples of Compensating Power Amplifier Noise", filed May 22, 2018, pp. all.

*Primary Examiner* — Khanh C Tran
(74) *Attorney, Agent, or Firm* — Dorsey & Whitney LLP

(57) ABSTRACT

Examples described herein include methods, devices, and systems which may compensate input data for non-linear power amplifier noise to generate compensated input data. In compensating the noise, during an uplink transmission time interval (TTI), a switch path is activated to provide amplified input data to a receiver stage including a coefficient calculator. The coefficient calculator may calculate an error representative of the noise based partly on the input signal to be transmitted and a feedback signal to generate coefficient data associated with the power amplifier noise. The feedback signal is provided, after processing through the receiver, to a coefficient calculator. During an uplink TTI, the amplified input data may also be transmitted as the RF wireless transmission via an RF antenna. During a downlink TTI, the switch path may be deactivated and the receiver stage may receive an additional RF wireless transmission to be processed in the receiver stage.

20 Claims, 10 Drawing Sheets

(51) Int. Cl.
*H04L 5/14* (2006.01)
*H03M 13/15* (2006.01)

(52) U.S. Cl.
CPC .......... *H04L 1/0057* (2013.01); *H04L 1/0071* (2013.01); *H04L 5/14* (2013.01)

(58) Field of Classification Search
CPC ..... H03F 2201/3233; H03F 2201/3224; H03F 1/3241; H04L 27/368; H04L 1/0057; H04L 27/367; H04L 2025/03414; H04L 1/0071; H03M 13/156
See application file for complete search history.

(56) References Cited

U.S. PATENT DOCUMENTS

| | | | |
|---|---|---|---|
| 2009/0232191 A1* | 9/2009 | Gupta | H04L 27/2096 375/216 |
| 2010/0277236 A1* | 11/2010 | Horiguchi | H03F 1/30 330/149 |
| 2010/0329387 A1* | 12/2010 | Watanabe | H04B 1/0475 375/296 |
| 2011/0064162 A1 | 3/2011 | McCallister et al. | |
| 2012/0155572 A1* | 6/2012 | Kim | H03F 1/3247 375/297 |
| 2013/0002357 A1* | 1/2013 | Thomsen | H03G 3/34 330/279 |
| 2016/0094318 A1 | 3/2016 | Shattil | |
| 2016/0094895 A1 | 3/2016 | Stadelmeier et al. | |
| 2017/0078054 A1* | 3/2017 | Hadani | H04L 5/0023 |
| 2017/0279479 A1* | 9/2017 | Adams | H04B 1/0483 |
| 2018/0123622 A1* | 5/2018 | Tan | H03F 3/00 |

* cited by examiner

WIRELESS DEVICES AND SYSTEMS INCLUDING EXAMPLES OF COMPENSATING POWER AMPLIFIER NOISE

CROSS REFERENCE TO RELATED APPLICATION(S)

This application is a continuation of pending U.S. patent application Ser. No. 15/986,555 filed May 22, 2018. The aforementioned application is incorporated herein by reference in its entirety, for any purpose.

BACKGROUND

Digital signal processing for wireless communications, such as digital baseband processing or digital front-end implementations, may be implemented using hardware (e.g. silicon) computing platforms. For example, multimedia processing and digital radio frequency (RF) processing may be accomplished by an application-specific integrated circuit (ASIC) which may implement a digital front-end for a wireless transceiver. A variety of hardware platforms are available to implement digital signal processing, such as the ASIC, a digital signal processor (DSP) implemented as part of a field-programmable gate array (FPGA), or a system-on-chip (SoC). However, each of these solutions often requires implementing customized signal processing methods that are hardware-implementation specific. For example, a digital signal processor may implement a specific portion of digital processing at a cellular base station, such as filtering interference based on the environmental parameters at that base station. Each portion of the overall signal processing performed may be implemented by different, specially-designed hardware, creating complexity.

Moreover, there is an increasing interest in moving wireless communications to "fifth generation" (5G) systems. 5G offers promise of increased speed and ubiquity, but methodologies for processing 5G wireless communications have not yet been set. In some implementations of 5G wireless communications, "Internet of Things" (IoT) devices may operate on a narrowband wireless communication standard, which may be referred to as Narrow Band IoT (NB-IoT). For example, Release 13 of the 3GPP specification describes a narrowband wireless communication standard.

DETAILED DESCRIPTION

Figure 1:
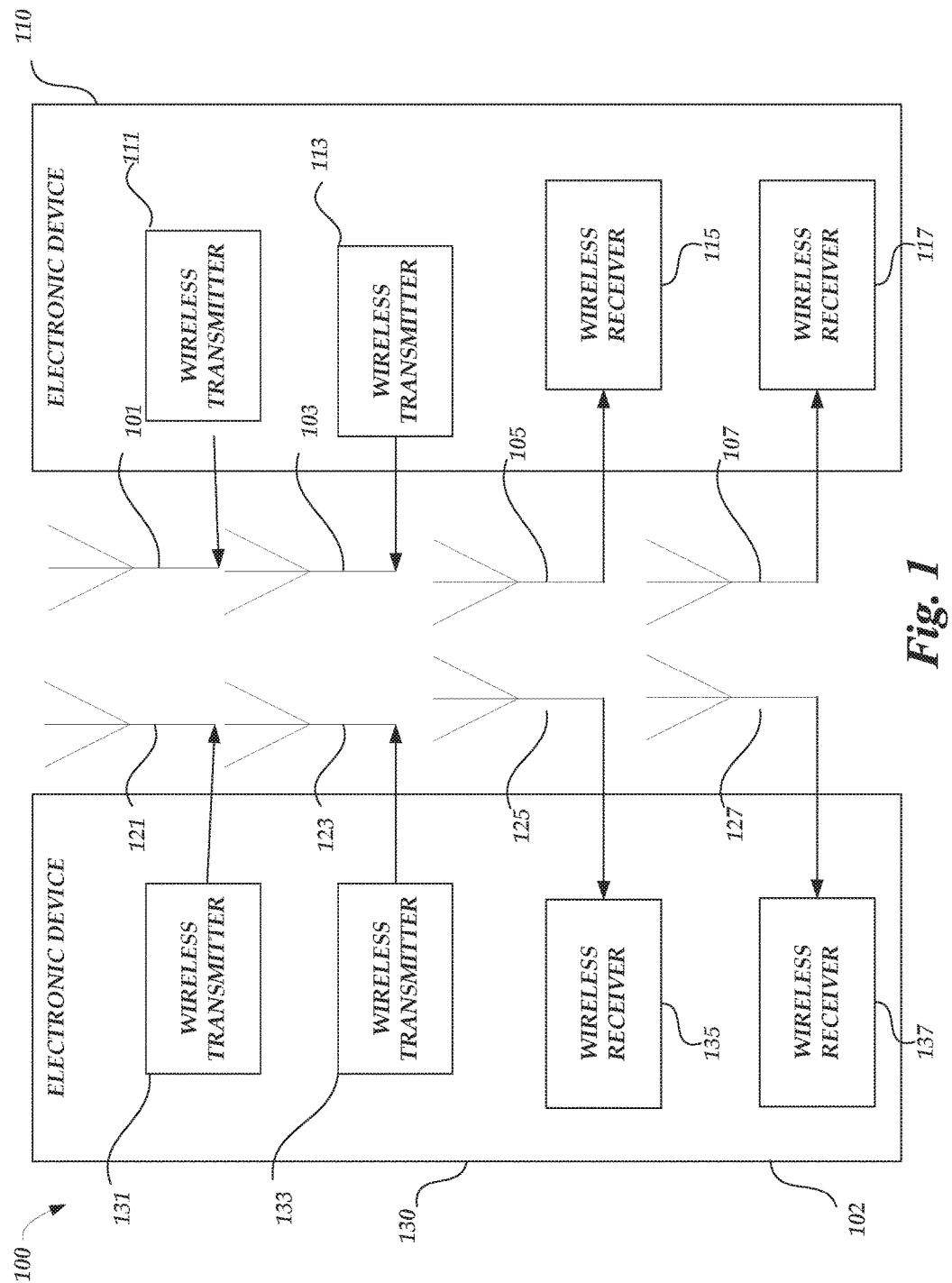
FIG. 1 is a schematic illustration of a system arranged in accordance with examples described herein.

Examples described herein include wireless devices and systems which may include examples of compensating power amplifier noise. Digital pre-distortion (DPD) filters may be utilized to compensate nonlinear power amplifier noise, such as power amplifier noise found in wireless devices and systems with power amplifiers. For example, an RF power amplifier (PA) may be utilized in transmitters of wireless devices and systems to amplify wireless transmission signals that are to be transmitted. Such nonlinear power amplifier noise from power amplifiers may be difficult to model, and, accordingly, DPD filters are utilized to compensate such nonlinear power amplifier noise, thereby reducing noises introduced into the wireless transmission signal from a power amplifier during transmission. Conventional wireless devices and systems may utilize specially-designed hardware to implement a DPD filter in a wireless device or system. For example, a DPD filter may be implemented in a variety of hardware platforms, as part of a wireless transceiver or transmitter.

As described herein, a coefficient calculator in a wireless device or system may utilize feedback after processing of a compensated wireless transmission signal to determine how efficiently the DPD filter is compensating such wireless transmission signals. For example, in determining how efficiently the DPD filter is performing compensation for nonlinear power amplifier noise, the coefficient calculator may calculate an error signal between an initial wireless transmission signal and the compensated, amplified wireless transmission signal to reduce error in a model of the DPD filter (e.g., coefficient data utilized to model a compensation filter). Conventional wireless devices may include a specific path with a receiver portion to process a feedback signal at a DPD filter, which may be inefficient in utilizing computational resources and/or board space to provide such a path for the feedback. That specific path with the receiver portion to process the feedback signal may be in addition to a wireless receiver path for a wireless receiver portion of the wireless device. Accordingly, chip architectures in which the feedback signal is provided to a coefficient calculator in an efficient scheme may be desired to reduce computational resources needed and/or optimize the board space of that wireless chip.

In the examples described herein, a time division duplexing (TDD) configured radio frame is utilized in conjunction with a single receiver path to provide both a feedback signal to a coefficient calculator and to receive wireless transmission signals, which may be received at a wireless receiver portion of a wireless device. In accordance with the examples described herein, a switch may activate a path to provide the feedback signal through the wireless receiver path to the coefficient calculator, when the wireless receiver path is not receiving an active wireless signal. For example, the wireless receiver path may not receive an active wireless signal during an uplink time period of a TDD configured radio frame. The uplink time period of the TDD configured radio frame can be referred to as an uplink transmission time interval (TTI). Similarly, the downlink time period of the TDD configured radio frame can be referred to as a downlink transmission time interval (TTI). During an uplink TTI, the switch may be activated to provide the feedback through the wireless receiver path to the coefficient calculator. In providing the feedback over multiple uplink TTIs, the coefficient calculator may provide the coefficients of a model that compensate for nonlinear power amplifier noise. Additionally, during downlink TTIs, the switch may deactivate the path that provides feedback through the wireless receiver path, so that the wireless receiver portion of a wireless transceiver may receive wireless transmission signals, thereby providing for efficient TDD frames to both provide the feedback signal to the coefficient calculator and to receive wireless signals using the same wireless receiver path.

FIG. 1 is a schematic illustration of a system 100 arranged in accordance with examples described herein. System 100 includes electronic device 102, electronic device 110, antenna 101, antenna 103, antenna 105, antenna 107, antenna 121, antenna 123, antenna 125, antenna 127, wireless transmitter 111, wireless transmitter 113, wireless receiver 115, wireless receiver 117, wireless transmitter 131, wireless transmitter 133, wireless receiver 135 and, wireless receiver 137. The electronic device 102 may include antenna 121, antenna 123, antenna 125, antenna 127, wireless transmitter 131, wireless transmitter 133, wireless receiver 135, and wireless receiver 137. The electronic device 110 may include antenna 101, antenna 103, antenna 105, antenna 107, wireless transmitter 111, wireless transmitter 113, wireless receiver 115, and wireless receiver 117. In operation, electronic devices 102, 110 can communicate wireless communication signals between the respective antennas of each electronic device. In an example of a TDD mode, wireless transmitter 131 coupled to antenna 121 may transmit to antenna 105 coupled to wireless receiver 115 during an uplink period of the TDD configured radio frame, while, at the same time or during at least a portion of the same time, the wireless transmitter may also activate a switch path that provides a feedback signal to a coefficient calculator of wireless transmitter 131.

The coefficient calculator of wireless transmitter 131 may provide the coefficients that are utilized in a model to at least partially compensate for power amplifier noise internal to the wireless transmitter 131. The wireless transmitter 131 may include a power amplifier that amplifies wireless transmission signals before providing such respective wireless transmission signals to the antenna 121 for RF transmission. In some examples, the coefficient calculator wireless transmitter 131 may also provide (e.g., optimize) the coefficients to also at least partially compensate power amplifier noise from other components of the electronic device 102, such as a power amplifier of the wireless transmitter 133. After an uplink period of a time division duplexing (TDD) configured radio frame has passed, the wireless receiver 135 and/or the wireless receiver 137 may receive wireless signals during a downlink period of the time division duplexing configured radio frame. For example, the wireless receiver 135 and/or the wireless receiver 137 may receive individual signals or a combination of signals (e.g., a MIMO signal) from the electronic device 110, having transmitted wireless signals from the wireless transmitter 111 coupled to the antenna 101 and/or from the wireless transmitter 113 coupled to the antenna 103. Power amplifier noise may generally refer to any noise in a signal to be transmitted from an electronic device that may be at least partially generated by one or more power amplifiers of that electronic device.

Electronic devices described herein, such as electronic device 102 and electronic device 110 shown in FIG. 1 may be implemented using generally any electronic device for which communication capability is desired. For example, electronic device 102 and/or electronic device 110 may be implemented using a mobile phone, smartwatch, computer (e.g. server, laptop, tablet, desktop), or radio. In some examples, the electronic device 102 and/or electronic device 110 may be incorporated into and/or in communication with other apparatuses for which communication capability is desired, such as but not limited to, a wearable device, a medical device, an automobile, airplane, helicopter, appliance, tag, camera, or other device.

While not explicitly shown in FIG. 1, electronic device 102 and/or electronic device 110 may include any of a variety of components in some examples, including, but not limited to, memory, input/output devices, circuitry, processing units (e.g. processing elements and/or processors), or combinations thereof.

The electronic device 102 and the electronic device 110 may each include multiple antennas. For example, the electronic device 102 and electronic device 110 may each have more than two antennas. Three antennas each are shown in FIG. 1, but generally any number of antennas may be used including 2, 3, 4, 5, 6, 7, 8, 9, 10, 11, 12, 13, 14, 15, 16, 32, or 64 antennas. Other numbers of antennas may be used in other examples. In some examples, the electronic device 102 and electronic device 110 may have a same number of antennas, as shown in FIG. 1. In other examples, the electronic device 102 and electronic device 110 may have different numbers of antennas. Generally, systems described herein may include multiple-input, multiple-output ("MIMO") systems. MIMO systems generally refer to systems including one or more electronic devices which transmit transmissions using multiple antennas and one or more electronic devices which receive transmissions using multiple antennas. In some examples, electronic devices may both transmit and receive transmissions using multiple antennas. Some example systems described herein may be "massive MIMO" systems. Generally, massive MIMO systems refer to systems employing greater than a certain number (e.g. 64) antennas to transmit and/or receive transmissions. As the number of antennas increase, so to generally does the complexity involved in accurately transmitting and/or receiving transmissions.

Although two electronic devices (e.g. electronic device 102 and electronic device 110) are shown in FIG. 1, generally the system 100 may include any number of electronic devices.

Electronic devices described herein may include receivers, transmitters, and/or transceivers. For example, the electronic device 102 of FIG. 1 includes wireless transmitter 131 and wireless receiver 135, and the electronic device 110 includes wireless transmitter 111 and wireless receiver 115. Generally, receivers may be provided for receiving transmissions from one or more connected antennas, transmitters may be provided for transmitting transmissions from one or more connected antennas, and transceivers may be provided for receiving and transmitting transmissions from one or more connected antennas. While both electronic devices 102, 110 are depicted in FIG. 1 with individual wireless transmitter and individual wireless receivers, it can be appreciated that a wireless transceiver may be coupled to antennas of the electronic device and operate as either a wireless transmitter or wireless receiver, to receive and transmit transmissions. For example, a transceiver of electronic device 102 may be used to provide transmissions to and/or receive transmissions from antenna 121, while other transceivers of electronic device 110 may be provided to provide transmissions to and/or receive transmissions from antenna 101 and antenna 103. Generally, multiple receivers, transmitters, and/or transceivers may be provided in an electronic device—one in communication with each of the antennas of the electronic device. The transmissions may be in accordance with any of a variety of protocols, including, but not limited to 5G signals, and/or a variety of modulation/demodulation schemes may be used, including, but not limited to: orthogonal frequency division multiplexing (OFDM), filter bank multi-carrier (FBMC), the generalized frequency division multiplexing (GFDM), universal filtered multi-carrier (UFMC) transmission, bi orthogonal frequency division multiplexing (BFDM), sparse code multiple access (SCMA), non-orthogonal multiple access (NOMA), multi-user shared access (MUSA) and faster-than-Nyquist (FTN) signaling with time-frequency packing. In some examples, the transmissions may be sent, received, or both, in accordance with 5G protocols and/or standards.

Examples of transmitters, receivers, and/or transceivers described herein, such as the wireless transmitter 131 and the wireless transmitter 111 may be implemented using a variety of components, including, hardware, software, firmware, or combinations thereof. For example, transceivers, transmitters, or receivers may include circuitry and/or one or more processing units (e.g. processors) and memory encoded with executable instructions for causing the transceiver to perform one or more functions described herein (e.g. software).

Figure 2:
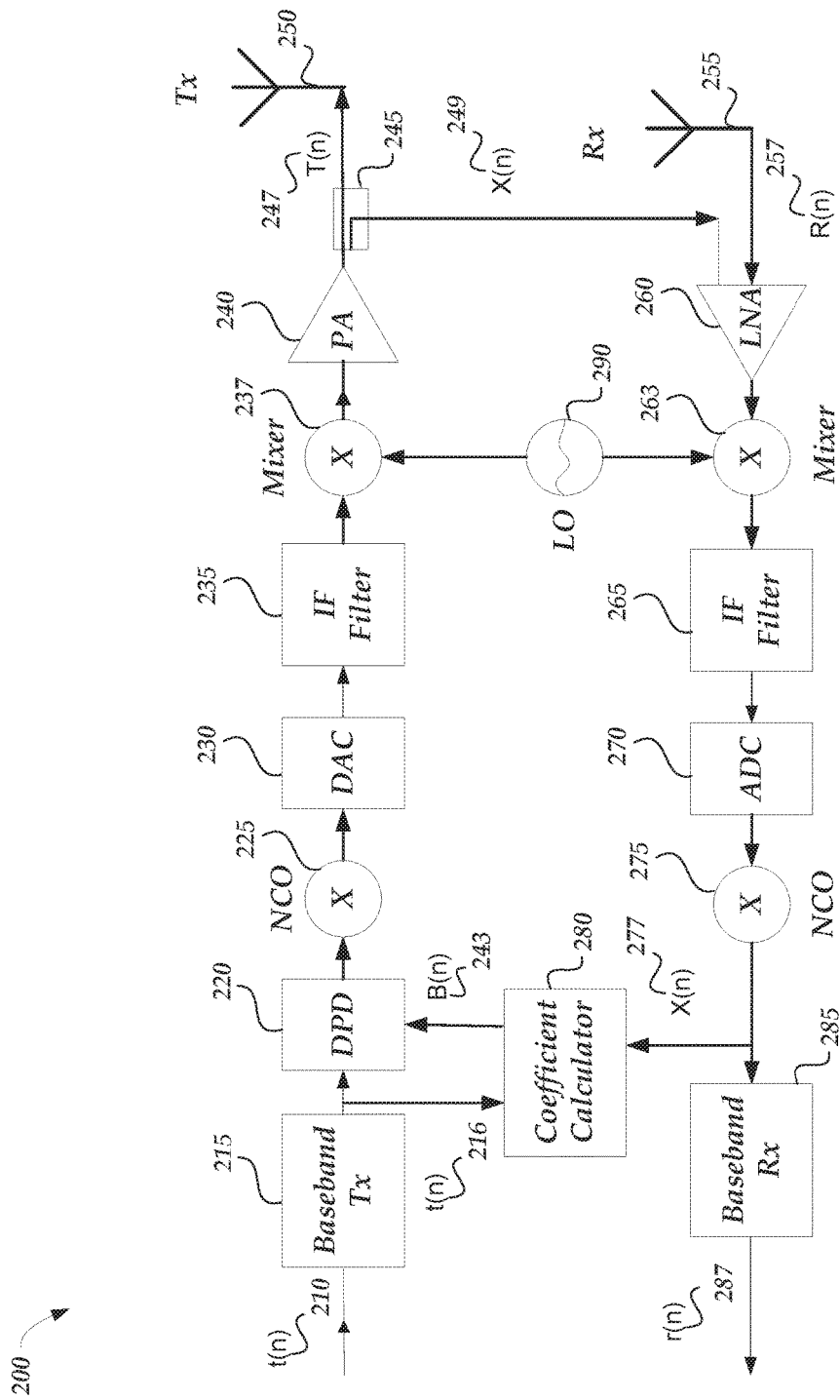
FIG. 2 is a schematic illustration of an electronic device arranged in accordance with examples described herein.

FIG. 2 is a schematic illustration of an electronic device 200 arranged in accordance with examples described herein. Electronic device 200 includes a baseband transmitter (Tx) 215 and a baseband receiver (Rx) 285, each respectively having a transmitter path and a receiver path to/from transmitting antenna (Tx) 250 and receiving antenna (Rx) 255. Electronic device 200 may represent an implementation of the electronic device 102, 110; with the baseband transmitter 215 and transmitter path representing a wireless transmitter 131, 133 or wireless transmitter 111, 113, and with the baseband receiver 285 representing a wireless receiver 135, 137 or wireless receiver 115, 117.

After having received a signal to be transmitted t(n) 210, the baseband transmitter 215 may perform baseband processing on that signal to be transmitted t(n) 210 to generate a baseband signal to be transmitted t(n) 216. The signal 216 is provided to the coefficient calculator 280 and also provided, along the transmitter path towards the transmitting antenna 250, to a digital pre-distortion (DPD) filter 220. The DPD filter 220 at least partially compensates the signal t(n) 216 based on a model including coefficient data (e.g., a plurality of coefficients) provided to the DPD filter by the coefficient calculator 280. The DPD filter 220 utilizes the model based on the coefficient data to at least partially compensate the signal 216 for noise in the electronic device 200, such as nonlinear power amplifier noise generated by the power amplifier 240. As will be described with respect to the coefficient calculator 280, the coefficient data may be determined to reduce the error introduced into the signal to be transmitted t(n) 216 by nonlinear power amplifier noise, when that signal 216 is amplified by power amplifier 240 for transmission at the transmitting antenna 250.

After having been at least partially compensated for noise by the DPD filter 220, the signal to be transmitted t(n) may be further processed along the transmitter path towards the transmitting antenna 250. Accordingly, the compensated signal 216 is processed by the numerically controlled oscillator (NCO) 225, the digital to analog converter 230, the intermediate frequency (IF) filter 235, the mixer 237 in conjunction with a provided local oscillating signal from the local oscillator 290, and the power amplifier 240 to generate amplified signal to be transmitted T(n) 247. The signal to be transmitted T(n) 247 is provided to the transmitting antenna 250 via a switch 245. The transmitter path to the transmitting antenna 250 includes a path through the switch 245 for transmission of any signal to be transmitted. That same amplified signal to be transmitted T(n) 247 is provided to the receiver path via the switch 245, when the switch 245 is activated, as the signal X(n) 249.

The switch 245 may be activated by a control signal (e.g., a selection signal) that indicates an uplink (TTI) is occurring in a time division duplexing configured radio frame that the electronic device 200 utilizes. When the switch 245 is activated, the amplified signal to be transmitted T(n) 247 is provided to the receiver path of the electronic device 200 to be used as a feedback signal in calculations performed by the coefficient calculator 280. The amplified signal to be transmitted T(n) 247 is provided to the receiver path as the signal X(n) 249, starting at the low noise amplifier (LNA) 260. The signal X(n) 249 and the amplified signal to be transmitted T(n) 247 represent the same signal processed by the power amplifier 240. The signal X(n) 249 and the amplified signal to be transmitted T(n) 247 are both provided by the switch 245, when the switch 245 is activated, to the receiver path of the electronic device 200 and the transmitting antenna 250, respectively. Accordingly, the signal X(n) 249 is processed by the LNA 260, the mixer 263 in conjunction with the provided local oscillating signal from the local oscillator 290, the intermediate frequency (IF) filter 265, the analog-to-digital converter 270, and the numerically controlled oscillator (NCO) 275 to generate the feedback signal X(n) 277 that is provided to the coefficient calculator 280. The coefficient calculator 280 may also receive the control signal indicating that an uplink time period is occurring, and may receive the feedback signal X(n) 277 to process that signal in a calculation to reduce the error introduced by the nonlinear power amplifier noise generated by the power amplifier 240.

After receiving the feedback signal X(n) 277, the coefficient calculator 280 may determine to calculate an error signal between the signal to be transmitted t(n) 216 and the compensated wireless transition signal to reduce error in a model of the DPD filter 220. The coefficient calculator utilizes the error signal to determine and/or update coefficient data B(n) 243 (e.g., a plurality of coefficients) provided to the DPD filter 220 for utilization in a model of the DPD filter 220 that at least partially compensates non-linear power amplifier noise. For the coefficient calculator 280 to calculate the plurality of coefficients, the coefficient calculator 280 may compute an error signal for reducing a difference between the signal to be transmitted t(n) 216 that is input to the DPD filter 220 and the feedback signal X(n) 277. For example, the difference may be reduced (e.g., minimized) by utilizing Equation (1):

$$z(k) = \left[1 + \sum_{p=2}^{P} \sum_{m=-M}^{M} a_{p,m} \cdot |y(k-m)|^{p-1}\right] \cdot y(k) \quad (1)$$

The signal to be transmitted t(n) 216 may be calculated in Equation (1) as z(k). The feedback signal X(n) 277 may be calculated in Equation (1) as y(k), to be summed over 'p' and 'm,' where 'P' represents the non-linear order of the power amplifier noise to be compensated and 'M' represents a "memory" of the coefficient calculator 280. For example, the coefficient calculator may store previous versions of the feedback signal X(n) 277, with the 'm' term representative of an offset of the feedback signal X(n) 277, such that the offset indicates a number of time periods between a received feedback signal X(n) 277 and a previous version of the feedback signal X(n) 277, received at 'm' time periods before the feedback signal X(n) 277 had been received at the coefficient calculator 280 to perform the calculation. In the example, 'P' may represent the number of filter taps for a model of the DPD filter 220 to at least partially compensate a nonlinearity of the power amplifier noise. In various implementations, 'P' may equal 1, 2, 3, 4, 7, 9, 10, 12, 16, 20, 100, or 200. Additionally or alternatively, 'M' may equal 0, 1, 2, 3, 4, 7, 9, 10, 12, 16, 20, 100, or 200. The coefficient calculator 280 may utilize Equation (1) in conjunction with an algorithm to reduce (e.g., minimize) the difference between z(k) and y(k), such as least-mean-squares (LMS) algorithm, least-squares (LS) algorithm, or total-least-squares (TLS) algorithm. Accordingly, in reducing the difference between z(k) and y(k), the coefficient calculator determines the coefficient data B(n) 243, as the terms $a_{p,m}$ in Equation 1, to be utilized in the DPD filter 220. In some implementations, sample vectors may be utilized, instead of the signal to be transmitted t(n) 216, to determine an initial set of the coefficient data B(n) 243.

In some examples, the coefficient calculator determines the coefficient data B(n) 243 to be utilized in the DPD filter 220 as a "memoryless" system in which the coefficient data B(n) 243 updates the DPD filter 220 with new coefficient data, replacing any coefficient data that the DPD filter utilized before receiving the coefficient data B(n) 243. Updating the DPD filter 220 with the coefficient data B(n) 243 may be referred to as optimizing the coefficient data, with some or all of the coefficient data being updated. For example, Equation (1) may be reduced to Equation (2) when other versions of the feedback signal X(n) 277 are not utilized in the calculation, thereby reduced the 'm' term to zero, such that Equation (1) reduces to Equation (2):

$$z(k) = \left[1 + \sum_{p=2}^{P} a_p \cdot |y(k)|^{p-1}\right] \cdot y(k) \quad (2)$$

In utilizing the same receiver path for processing of a received signal and the aforementioned generation of a feedback signal, the electronic device 200 may utilize board space and/or resources on a circuit implementing the electronic device 200, as compared to an electronic device that includes a separate path for the feedback signal and a separate path for processing of a received signal. For example, electronic device 200 utilizes the LNA 260, the mixer 263 in conjunction with the provided local oscillating signal from the local oscillator 290, the intermediate frequency (IF) filter 265, the analog-to-digital converter 270, and the numerically controlled oscillator (NCO) 275 for both generation of a feedback signal X(n) 277 and for processing of a received signal R(n) 257. As described, when the switch 245 is activated, the electronic device 200 utilizes the LNA 260, the mixer 263 in conjunction with the provided local oscillating signal from the local oscillator 290, the intermediate frequency (IF) filter 265, the analog-to-digital converter 270, and the numerically controlled oscillator (NCO) 275 to generate a feedback signal X(n) 277 and calculates coefficient data with the coefficient calculator 280. When the switch 245 is deactivated, the electronic device 200 utilizes the LNA 260, the mixer 263 in conjunction with the provided local oscillating signal from the local oscillator 290, the intermediate frequency (IF) filter 265, the analog-to-digital converter 270, and the numerically controlled oscillator (NCO) 275 to receive and process the received signal R(n) 257.

The switch 245 may be deactivated at the end of activation period. For example, the control signal that activates the switch 245 may include information that specifies how long the switch 245 is to be activated, e.g., an activation period. The activation period may be the same as an uplink TTI of a time-division duplexing configured radio frame that the electronic device 200 utilizes. For example, as described with reference to FIG. 6, the activation period may be a specific uplink TTI that operates at a different time period than a downlink TTI. In some examples, the switch 245 may be activated for the length of the signal 216, which may be the same length as the signal 210. Additionally or alternatively, the switch 245 may be deactivated when a wireless signal is detected at the receiving antenna 255. For example, a control signal may indicate the start of a downlink TTI when a signal is detected at the receiving antenna 255, which indicates that the activation period has finished. Accordingly, the switch 245 may deactivated.

The switch 245 may be deactivated by a control signal that indicates a downlink TTI is occurring in a time division duplexing configured radio frame that the electronic device 200 utilizes. Accordingly, a signal X(n) 249 is not provided to the receiver path of the electronic device 200 because the switch 245 is deactivated. With the switch 245 deactivated, the received signal R(n) 257 is provided to the receiver path of the electronic device 200 to processed in the receiver path for the generation of a baseband received signal 287. The received signal R(n) 257 is provided to the receiver path, starting at the low noise amplifier (LNA) 260. Accordingly, the received signal R(n) 257 is processed by the LNA 260, the mixer 263 in conjunction with the provided local oscillating signal from the local oscillator 290, the intermediate frequency (IF) filter 265, the analog-to-digital converter 270, the numerically controlled oscillator (NCO) 275, and the baseband receiver 285 to generate the baseband received signal 287. In generating the baseband received signal 287, the electronic device 200 utilizes the same receiver path that is utilized to generate and provide a feedback signal to the coefficient calculator 280, thereby efficiently utilizing the computational resources and/or board space of the electronic device 200. Accordingly, the same receiver path of electronic device 200 is utilized for the receiving wireless signals during downlink time periods and providing feedback signals to the coefficient calculator during uplink time periods. In some examples, the coefficient calculator 280, while not being provided a feedback signal X(n) 277 during the downlink time period, may calculate and/or determine coefficient data while the received signal R(n) 257 is being processed. Accordingly, in conjunction with time division duplexing configured radio frames, the electronic device 200 utilizes a single receiver path to provide both the feedback signal X(n) 277 to the coefficient calculator 280 and to receive wireless transmission signals, such as the received signal R(n) 257 to provide baseband received signals r(n) 287.

Figure 3:
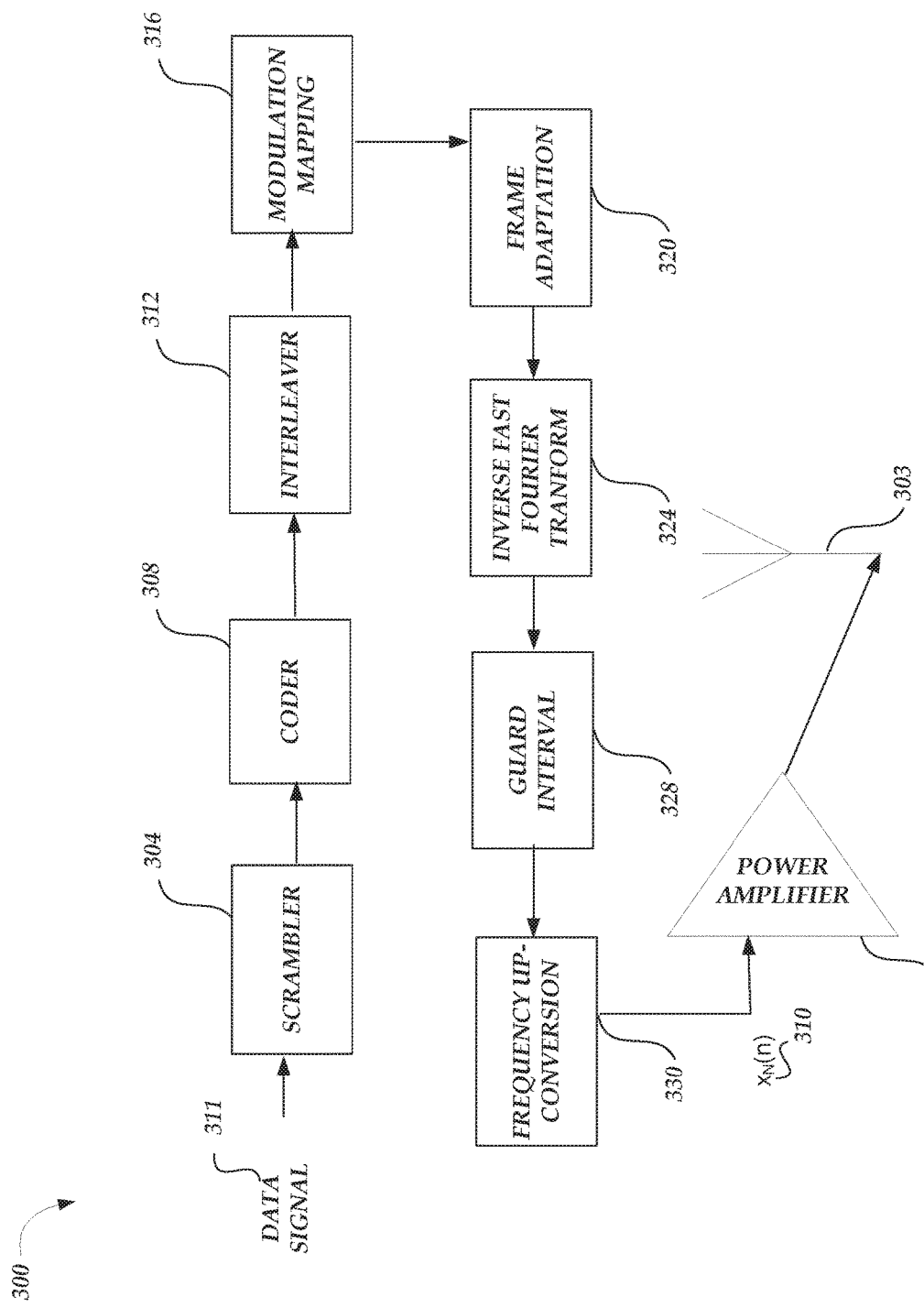
FIG. 3 is a schematic illustration of a wireless transmitter.

FIG. 3 is a schematic illustration of a wireless transmitter 300. The wireless transmitter 300 receives a data signal 311 and performs operations to generate wireless communication signals for transmission via the antenna 303. The transmitter output data $x_N(n)$ 310 is amplified by a power amplifier 332 before the output data are transmitted on an RF antenna 303. The operations to the RF-front end may generally be performed with analog circuitry or processed as a digital baseband operation for implementation of a digital front-end. The operations of the RF-front end include a scrambler 304, a coder 308, an interleaver 312, a modulation mapping 316, a frame adaptation 320, an IFFT 324, a guard interval 328, and frequency up-conversion 330.

The scrambler 304 may convert the input data to a pseudo-random or random binary sequence. For example, the input data may be a transport layer source (such as MPEG-2 Transport stream and other data) that is converted to a Pseudo Random Binary Sequence (PRBS) with a generator polynomial. While described in the example of a generator polynomial, various scramblers 304 are possible.

The coder 308 may encode the data outputted from the scrambler to code the data. For example, a Reed-Solomon (RS) encoder, turbo encoder may be used as a first coder to generate a parity block for each randomized transport packet fed by the scrambler 304. In some examples, the length of parity block and the transport packet can vary according to various wireless protocols. The interleaver 312 may interleave the parity blocks output by the coder 308, for example, the interleaver 312 may utilize convolutional byte interleaving. In some examples, additional coding and interleaving can be performed after the coder 308 and interleaver 312. For example, additional coding may include a second coder that may further code data output from the interleaver, for example, with a punctured convolutional coding having a certain constraint length. Additional interleaving may include an inner interleaver that forms groups of joined blocks. While described in the context of a RS coding, turbo coding, and punctured convolution coding, various coders 308 are possible, such as a low-density parity-check (LDPC) coder or a polar coder. While described in the context of convolutional byte interleaving, various interleavers 312 are possible.

The modulation mapping 316 may modulate the data output from the interleaver 312. For example, quadrature amplitude modulation (QAM) may be used to map the data by changing (e.g., modulating) the amplitude of the related carriers. Various modulation mappings may be used, including, but not limited to: Quadrature Phase Shift Keying (QPSK), SCMA NOMA, and MUSA (Multi-user Shared Access). Output from the modulation mapping 316 may be referred to as data symbols. While described in the context of QAM modulation, various modulation mappings 316 are possible. The frame adaptation 320 may arrange the output from the modulation mapping according to bit sequences that represent corresponding modulation symbols, carriers, and frames.

The IFFT 324 may transform symbols that have been framed into sub-carriers (e.g., by frame adaptation 320) into time-domain symbols. Taking an example of a 5G wireless protocol scheme, the IFFT can be applied as N-point IFFT:

$$x_k = \sum_{n=1}^{N} X_n e^{j2\pi kn/N} \quad (3)$$

where $X_n$ is the modulated symbol sent in the nth 5G sub-carrier. Accordingly, the output of the IFFT 324 may form time-domain 5G symbols. In some examples, the IFFT 324 may be replaced by a pulse shaping filter or poly-phase filtering banks to output symbols for frequency up-conversion 330.

In the example of FIG. 3, the guard interval 328 adds a guard interval to the time-domain 5G symbols. For example, the guard interval may be a fractional length of a symbol duration that is added, to reduce inter-symbol interference, by repeating a portion of the end of a time-domain 5G symbol at the beginning of the frame. For example, the guard interval can be a time period corresponding to the cyclic prefix portion of the 5G wireless protocol scheme.

The frequency up-conversion 330 may up-convert the time-domain 5G symbols to a specific radio frequency. For example, the time-domain 5G symbols can be viewed as a baseband frequency range and a local oscillator can mix the frequency at which it oscillates with the 5G symbols to generate 5G symbols at the oscillation frequency. A digital up-converter (DUC) may also be utilized to convert the time-domain 5G symbols. Accordingly, the 5G symbols can be up-converted to a specific radio frequency for an RF transmission.

Before transmission, at the antenna 303, a power amplifier 332 may amplify the transmitter output data $x_N(n)$ 310 to output data for an RF transmission in an RF domain at the antenna 303. The antenna 303 may be an antenna designed to radiate at a specific radio frequency. For example, the antenna 303 may radiate at the frequency at which the 5G symbols were up-converted. Accordingly, the wireless transmitter 300 may transmit an RF transmission via the antenna 303 based on the data signal 311 received at the scrambler 304. As described above with respect to FIG. 3, the operations of the wireless transmitter 300 can include a variety of processing operations. Such operations can be implemented in a conventional wireless transmitter, with each operation implemented by specifically-designed hardware for that respective operation. For example, a DSP processing unit may be specifically-designed to implement the IFFT 324. As can be appreciated, additional operations of wireless transmitter 300 may be included in a conventional wireless receiver.

The wireless transmitter 300 may be utilized to implement the wireless transmitters 111, 113 or wireless transmitters 131, 133 of FIG. 1, for example. The wireless transmitter 300 may also represent a configuration in which the DPD filter 220 and the coefficient calculator 280 may be utilized. For example, the DPD filter may at least partially compensate the data signal 311 before providing the data signal 311 to the scrambler 304. A coefficient calculator 280 may be implemented in the wireless transmitter 300, with signal paths to the coefficient calculator from any element of the transmitter path of the wireless transmitter 300.

Figure 4:
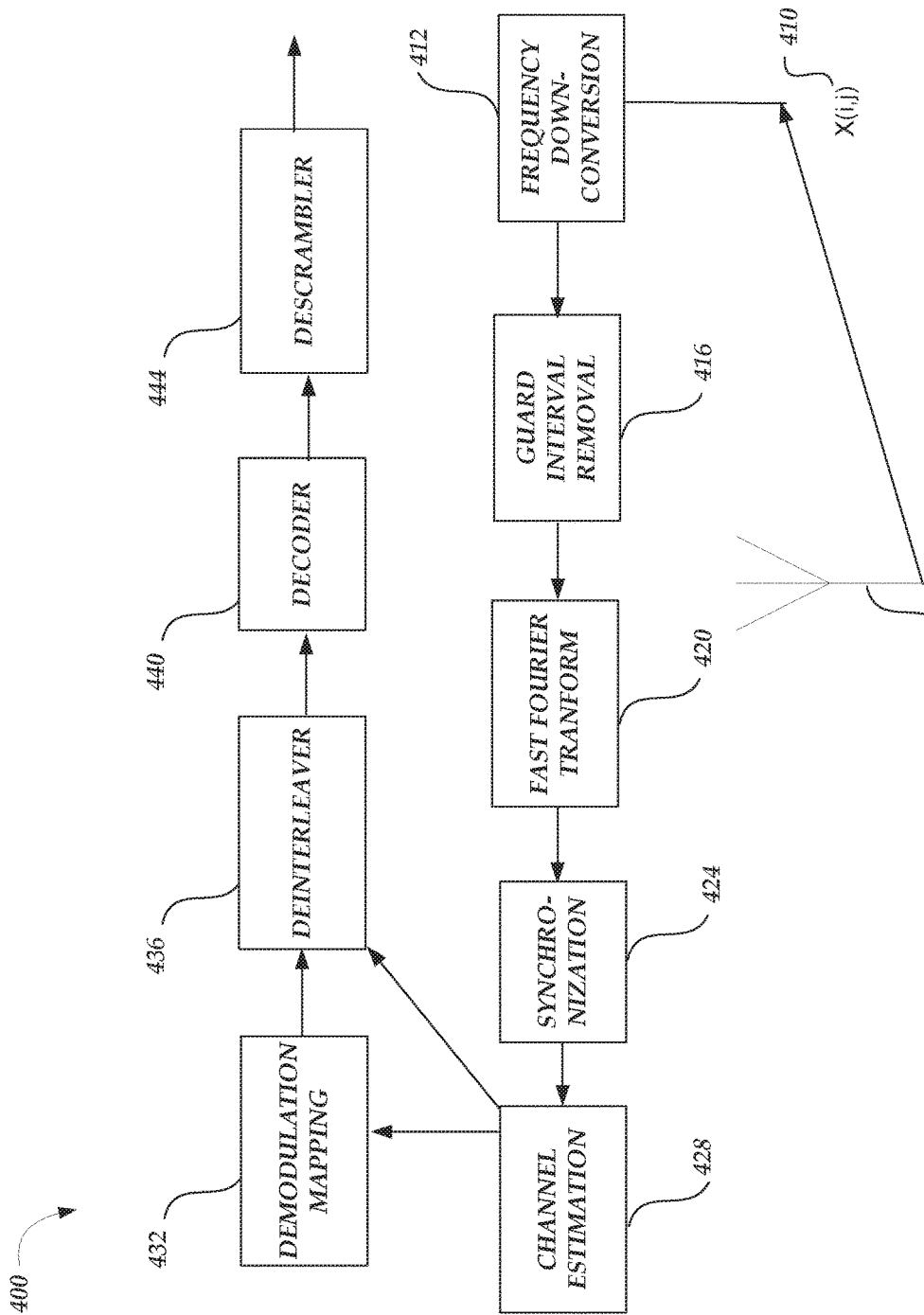
FIG. 4 is a schematic illustration of wireless receiver.

FIG. 4 is a schematic illustration of wireless receiver 400. The wireless receiver 400 receives input data X (i,j) 410 from an antenna 405 and performs operations of a wireless receiver to generate receiver output data at the descrambler 444. The antenna 405 may be an antenna designed to receive at a specific radio frequency. The operations of the wireless receiver may be performed with analog circuitry or processed as a digital baseband operation for implementation of a digital front-end. The operations of the wireless receiver include a frequency down-conversion 412, guard interval removal 416, a fast Fourier transform 420, synchronization 424, channel estimation 428, a demodulation mapping 432, a deinterleaver 436, a decoder 440, and a descrambler 444.

The frequency down-conversion 412 may down-convert the frequency domain symbols to a baseband processing range. For example, continuing in the example of a 5G implementation, the frequency-domain 5G symbols may be mixed with a local oscillator frequency to generate 5G symbols at a baseband frequency range. A digital downconverter (DDC) may also be utilized to convert the frequency domain symbols. Accordingly, the RF transmission including time-domain 5G symbols may be down-converted to baseband. The guard interval removal 416 may remove a guard interval from the frequency-domain 5G symbols. The FFT 420 may transform the time-domain 5G symbols into frequency-domain 5G symbols. Taking an example of a 5G wireless protocol scheme, the FFT can be applied as N-point FFT:

$$X_k = \sum_{k=1}^{N} x_n e^{-i2\pi k n/N} \quad (4)$$

where $X_n$ is the modulated symbol sent in the nth 5G sub-carrier. Accordingly, the output of the FFT 420 may form frequency-domain 5G symbols. In some examples, the FFT 420 may be replaced by poly-phase filtering banks to output symbols for synchronization 424.

The synchronization 424 may detect pilot symbols in the 5G symbols to synchronize the transmitted data. In some examples of a 5G implementation, pilot symbols may be detected at the beginning of a frame (e.g., in a header) in the time-domain. Such symbols can be used by the wireless receiver 400 for frame synchronization. With the frames synchronized, the 5G symbols proceed to channel estimation 428. The channel estimation 428 may also use the time-domain pilot symbols and additional frequency-domain pilot symbols to estimate the time or frequency effects (e.g., path loss) to the received signal.

For example, a channel may be estimated according to N signals received through N antennas (in addition to the antenna 405) in a preamble period of each signal. In some examples, the channel estimation 428 may also use the guard interval that was removed at the guard interval removal 416. With the channel estimate processing, the channel estimation 428 may at least partially compensate for the frequency-domain 5G symbols by some factor to reduce the effects of the estimated channel. While channel estimation has been described in terms of time-domain pilot symbols and frequency-domain pilot symbols, other channel estimation techniques or systems are possible, such as a MIMO-based channel estimation system or a frequency-domain equalization system.

The demodulation mapping 432 may demodulate the data outputted from the channel estimation 428. For example, a quadrature amplitude modulation (QAM) demodulator can map the data by changing (e.g., modulating) the amplitude of the related carriers. Any modulation mapping described herein can have a corresponding demodulation mapping as performed by demodulation mapping 432. In some examples, the demodulation mapping 432 may detect the phase of the carrier signal to facilitate the demodulation of the 5G symbols. The demodulation mapping 432 may generate bit data from the 5G symbols to be further processed by the deinterleaver 436.

The deinterleaver 436 may deinterleave the data bits, arranged as parity block from demodulation mapping into a bit stream for the decoder 440, for example, the deinterleaver 436 may perform an inverse operation to convolutional byte interleaving. The deinterleaver 436 may also use the channel estimation to at least partially compensate for channel effects to the parity blocks.

The decoder 440 may decode the data outputted from the scrambler to code the data. For example, a Reed-Solomon (RS) decoder or turbo decoder may be used as a decoder to generate a decoded bit stream for the descrambler 444. For example, a turbo decoder may implement a parallel concatenated decoding scheme. In some examples, additional decoding and/or deinterleaving may be performed after the decoder 440 and deinterleaver 436. For example, additional decoding may include another decoder that may further decode data output from the decoder 440. While described in the context of a RS decoding and turbo decoding, various decoders 440 are possible, such as low-density parity-check (LDPC) decoder or a polar decoder.

The descrambler 444 may convert the output data from decoder 440 from a pseudo-random or random binary sequence to original source data. For example, the descrambler 44 may convert decoded data to a transport layer destination (e.g., MPEG-2 transport stream) that is descrambled with an inverse to the generator polynomial of the scrambler 304. The descrambler thus outputs receiver output data. Accordingly, the wireless receiver 400 receives an RF transmission including input data X (i,j) 410 via to generate the receiver output data.

As described herein, for example with respect to FIG. 4, the operations of the wireless receiver 400 can include a variety of processing operations. Such operations can be implemented in a conventional wireless receiver, with each operation implemented by specifically-designed hardware for that respective operation. For example, a DSP processing unit may be specifically-designed to implement the FFT 420. As can be appreciated, additional operations of wireless receiver 400 may be included in a conventional wireless receiver.

The wireless receiver 400 may be utilized to implement the wireless receivers the wireless receivers 115, 117 or wireless receivers 135, 137 of FIG. 1, for example. The wireless receiver 400 may also represent a configuration in which the coefficient calculator 280 may be utilized. For example, wireless receiver 400 may provide a feedback signal to a coefficient calculator 280 after descrambling the feedback signal at the descrambler 444. Accordingly, a coefficient calculator 280 may be implemented in the wireless receiver 400 with a signal path to the coefficient calculator from the receiver path of the wireless receiver 400.

Figure 5:
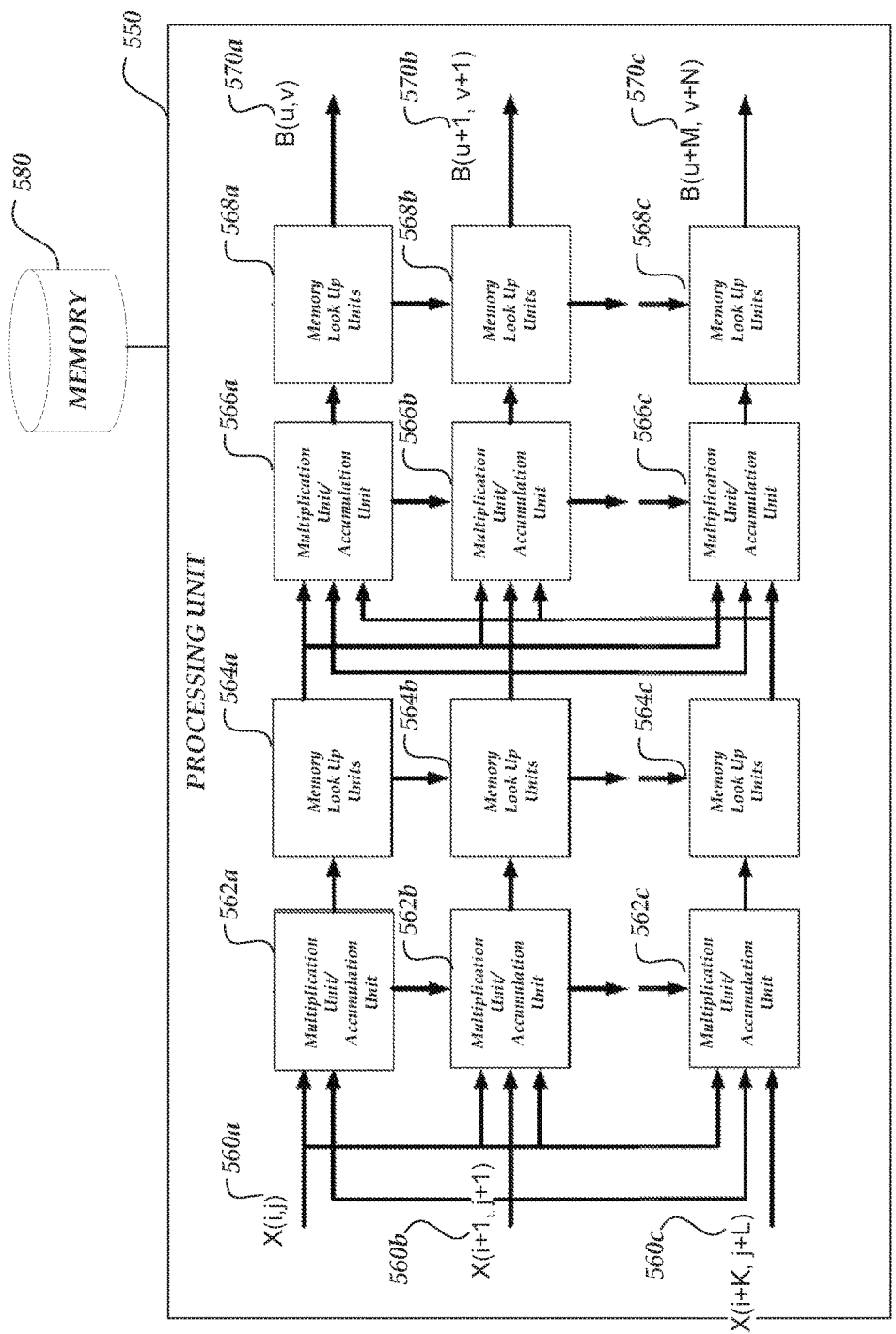
FIG. 5 is a schematic illustration of an example processing unit arranged in accordance with examples described herein.

FIG. 5 is a block diagram of a processing unit 550, which may be implemented as a coefficient calculator 280, in accordance with examples described herein. The processing unit 550 may receive input data (e.g. X (i,j)) 560*a-c* from such a computing system, such as t(n) 216 and/or X(n) 277. For example, if the input data 560*a-c* corresponds to a feedback signal, such as the feedback signal X(n) 277, the processing unit 550 may retrieve from memory 580, either a signal to be transmitted t(n) 210 or previous versions of the feedback signal, such as previously received feedback signals X(n) 277. The previously received feedback signals X(n) 277 may have been received at a different time period than the feedback signal X(n) 277 received during a current uplink time period. For example, the other feedback signals X(n) 277 stored in memory may have been received during previous uplink time periods before the current uplink time period.

Additionally or alternatively, the currently received feedback signal X(n) 277 may be stored in the memory 580 to be accessed by the processing unit 550 (e.g., coefficient calculator) for calculation of coefficient data. For example, the currently received feedback signal X(n) 277 may be stored in memory 580 during the current uplink time period, to be later calculated by the processing unit 550 during a downlink time period or another time period.

The processing unit 550 may include multiplication unit/accumulation units 562a-c, 566a-c and memory lookup units 564a-c, 568a-c that, that may generate output data (e.g. B (u,v)) 570a-c. The output data B (u,v)) 570a-c may be provided, for example in electronic device 200, as the coefficient data B(n) 243 to the DPD filter 220 for utilization in a model of the DPD filter 220 that at least partially compensates non-linear power amplifier noise. The processing unit 550, may be provided instructions that cause the processing unit 550 to configure the multiplication units 562a-c to multiply input data 560a-c with coefficient data and accumulation units 566a-c to accumulate processing results to generate the output data 570a-c, and thus provided as the coefficient data B(n) 243.

The multiplication unit/accumulation units 562a-c, 566a-c multiply two operands from the input data 560a-c to generate a multiplication processing result that is accumulated by the accumulation unit portion of the multiplication unit/accumulation units 562a-c, 566a-c. The multiplication unit/accumulation units 562a-c, 566a-c adds the multiplication processing result to update the processing result stored in the accumulation unit portion, thereby accumulating the multiplication processing result. For example, the multiplication unit/accumulation units 562a-c, 566a-c may perform a multiply-accumulate operation such that two operands, M and N, are multiplied and then added with P to generate a new version of P that is stored in its respective multiplication unit/accumulation units. The memory look-up units 564a-c, 568a-c retrieve data stored in memory 580. For example, the memory look-up unit can be a table look-up that retrieves a specific coefficient of additional coefficient data stored in the memory 580. For example, the memory 580 may additionally store previously calculated versions of the coefficient data B(n) 243. The output of the memory look-up units 564a-c, 568a-c is provided to the multiplication unit/accumulation units 562a-c, 566a c that may be utilized as a multiplication operand in the multiplication unit portion of the multiplication unit/accumulation units 562a-c, 566a-c. Using such a circuitry arrangement, the output data (e.g. B (u,v)) 570a-c may be generated from the input data (e.g. X (i,j)) 560a-c.

In some examples, coefficient data, for example from memory 580, can be mixed with the input data X (i,j) 560a-c to generate the output data B (u,v) 570a-c. The relationship of the coefficient data to the output data B (u,v) 570a-c based on the input data X (i,j) 560a-c may be expressed as:

$$B(u, v) = f\left(\sum_{m,n}^{M,N} a''_{m,n} f\left(\sum_{k,l}^{K,L} a'_{k,l} X(i+k, j+l)\right)\right) \quad (5)$$

where $a'_{k,l}$, $a''_{m,n}$ are coefficients for the first set of multiplication/accumulation units 562a-c and second set of multiplication/accumulation units 566a-c, respectively, and where f(●) stands for the mapping relationship performed by the memory look-up units 564a-c, 568a-c. As described above, the memory look-up units 564a-c, 568a-c retrieve previously calculated coefficient data (e.g., previous version of the coefficient data B(n) 243) to mix with the input data. Accordingly, the output data may be provided by manipulating the input data with multiplication/accumulation units using coefficient data stored in the memory 580. The resulting mapped data may be manipulated by additional multiplication/accumulation units using additional sets of coefficients stored in the memory associated with the desired wireless protocol.

Further, it can be shown that the system 500, as represented by Equation (5), may approximate any nonlinear mapping with arbitrarily small error in some examples and the mapping of system 500 is determined by the coefficients $a_{k,l}'$, $a_{m,n}''$. For example, if such coefficient data is specified, any mapping and processing between the input data X (i,j) 560a-c and the output data B (u,v) 570a-c may be accomplished by the system 500. Such a relationship, as derived from the circuitry arrangement depicted in system 500, may be used to train an entity of the computing system 500 to generate coefficient data. For example, using Equation (5), an entity of the computing system 500 may compare input data to the output data to generate the coefficient data.

In the example of system 500, the processing unit 550 mixes the coefficient data with the input data X (i,j) 560a-c utilizing the memory look-up units 564a-c, 568a-c. In some examples, the memory look-up units 564a-c, 568a-c can be referred to as table look-up units. The coefficient data may be associated with a mapping relationship for the input data X (i,j) 560a-c to the output data B (u,v) 570a-c. For example, the coefficient data may represent non-linear mappings of the input data X (i,j) 560a-c to the output data B (u,v) 570a-c. In some examples, the non-linear mappings of the coefficient data may represent a Gaussian function, a piece-wise linear function, a sigmoid function, a thin-plate-spline function, a multi-quadratic function, a cubic approximation, an inverse multi-quadratic function, or combinations thereof. In some examples, some or all of the memory look-up units 564a-c, 568a-c may be deactivated. For example, one or more of the memory look-up units 564a-c, 568a-c may operate as a gain unit with the unity gain.

Each of the multiplication unit/accumulation units 562a-c, 566a-c may include multiple multipliers, multiple accumulation unit, or and/or multiple adders. Any one of the multiplication unit/accumulation units 562a-c, 566a may be implemented using an ALU. In some examples, any one of the multiplication unit/accumulation units 562a-c, 566a-c can include one multiplier and one adder that each perform, respectively, multiple multiplications and multiple additions. The input-output relationship of a multiplication/accumulation unit 562, 566 may be represented as:

$$B_{Out} = \sum_{i=1}^{I} C_i * B_{in}(i) \quad (6)$$

where "I" represents a number to perform the multiplications in that unit, $C_i$ the coefficients which may be accessed from a memory, such as memory 580, and $B_{in}(i)$ represents a factor from either the input data X (i,j) 560a-c or an output from multiplication unit/accumulation units 562a-c, 566a-c. In an example, the output of a set of multiplication unit/accumulation units, $B_{out}$, equals the sum of coefficient data, $C_i$ multiplied by the output of another set of multiplication unit/accumulation units, $B_{in}(i)$. $B_{in}(i)$ may also be the input data such that the output of a set of multiplication unit/accumulation units, $B_{out}$, equals the sum of coefficient data, $C_i$ multiplied by input data.

While described above as the processing unit 550 implementing a coefficient calculator 280, additionally or alternatively, the coefficient calculator 280 can be implemented using one or more processing units (e.g., processing unit(s)

550), for example, having any number of cores. In various implementations, processing units can include an arithmetic logic unit (ALU), a bit manipulation unit, a multiplication unit, an accumulation unit, an adder unit, a look-up table unit, a memory look-up unit, or any combination thereof. For example, the processing unit 550 includes multiplication units, accumulation units, and, memory look-up units.

Figure 6:
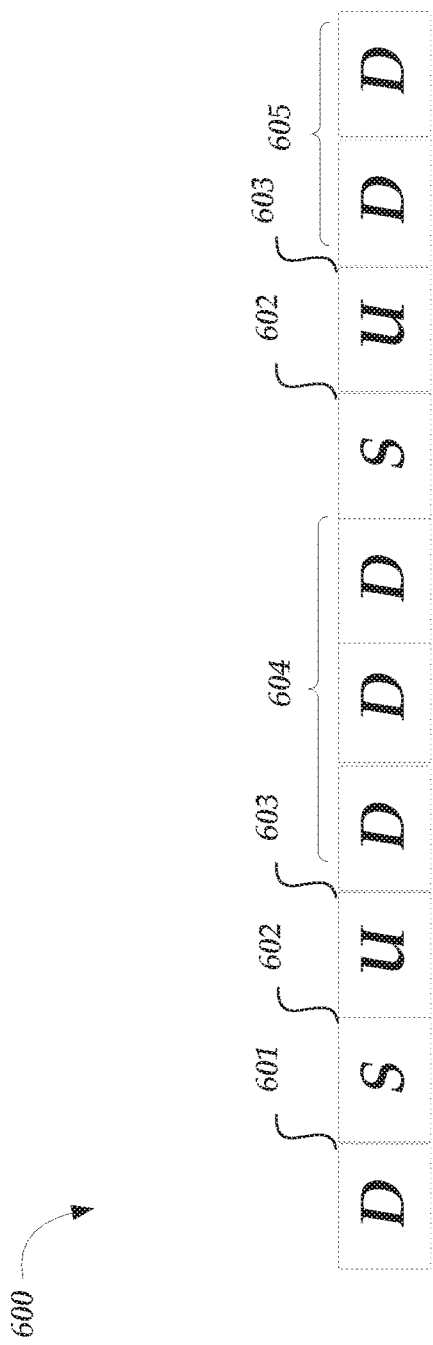
FIG. 6 is a schematic illustration of a time frame for a time-division multiplexing time period arranged in accordance with examples described herein.

FIG. 6 is a schematic illustration of a time frame 600 for a TDD transmission time interval (TTI) arranged in accordance with examples described herein. The time frame 600 includes downlink TTIs 601, 604, and 605. The time frame also includes uplink TTIs 603. The time frame 600 also includes special time frames 602, which may include additional uplink and/or downlink TTIs for special TDD time periods. For example, a special time period may be allocated in the time frame 600 for specific functionalities of a wireless protocol, such as signaling/handshaking. The downlink TTIs may be of varying time period lengths, as depicted, with the downlink TTI 604 being thrice as long as the downlink TTI 601.

The time frame 600 may be utilized in time-division duplexing configured radio frames for electronic devices described herein. For example, with respect to the electronic device 200, the switch 245 activates a path to provide the feedback signal X(n) 277 through the wireless receiver path to the coefficient calculator 280, when the wireless receiver path is not receiving an active wireless signal. For example, the wireless receiver path may not receive an active wireless signal during the uplink TTIs 603. Accordingly, during the uplink TTIs 603, the switch 245 may be activated to provide the feedback signal X(n) 277 through the wireless receiver path to the coefficient calculator 280. In providing the feedback over multiple uplink TTIs 603, the coefficient calculator 280 may provide the coefficients of a model that at least partially compensate for nonlinear power amplifier noise. Additionally or alternatively, during at least a portion of downlink TTIs 601, 604, and 605, the switch may deactivate the path that provides feedback signal X(n) 277 through the wireless receiver path, so that the wireless receiver portion of a wireless transceiver may receive wireless transmission signals R(n) 257, thereby providing for efficient TDD configured radio frames to both provide the feedback signal X(n) 277 to the coefficient calculator 280 and to receive wireless signals R(n) 257 using the same wireless receiver path.

Figure 7:
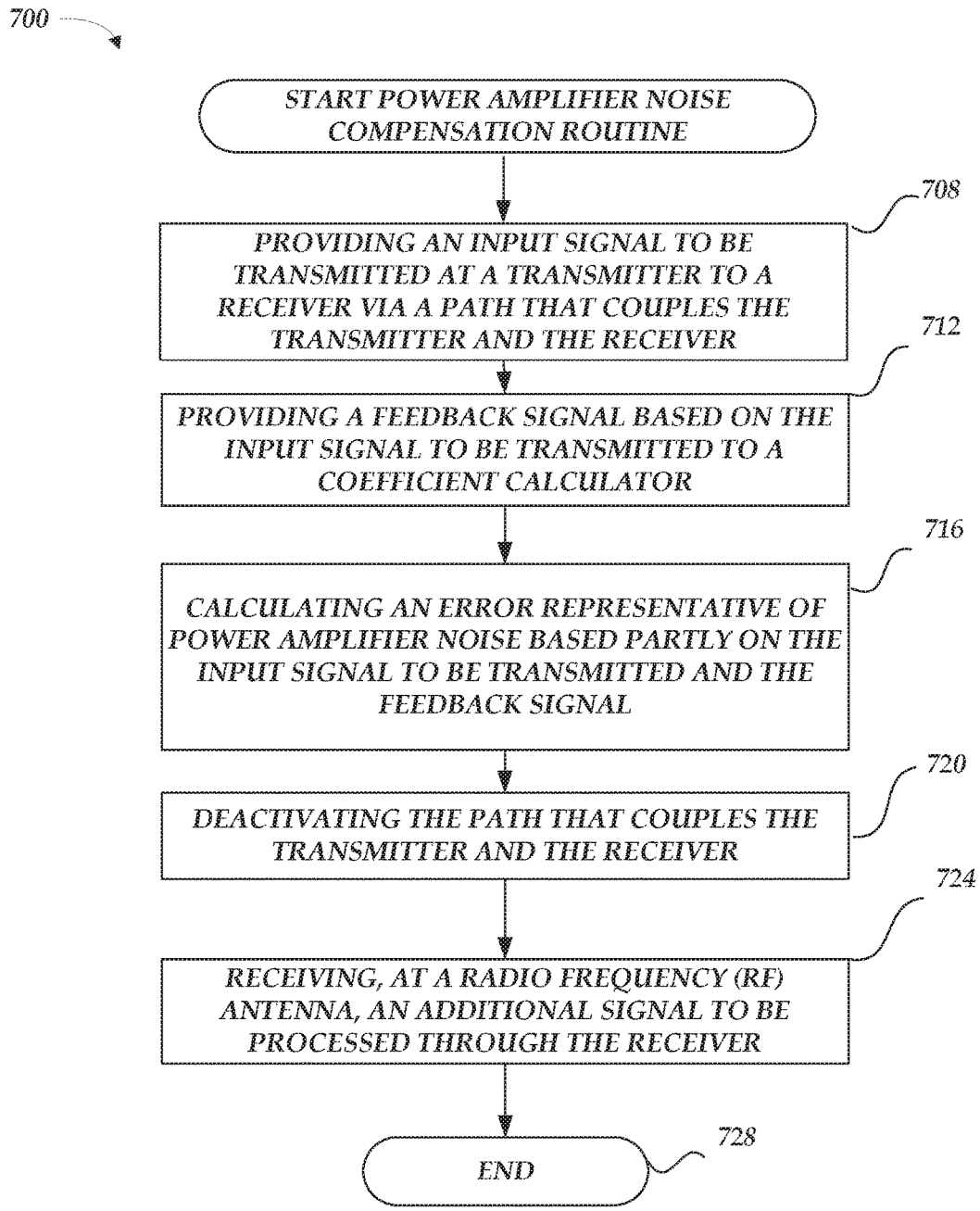
FIG. 7 is a schematic illustration of a power amplifier noise compensation method in accordance with examples described herein.

FIG. 7 is a schematic illustration of a full duplex compensation method 700 in accordance with examples described herein. Example method 700 may be implemented using, for example, electronic device 102, 110 of FIG. 1, electronic device 200 of FIG. 2, processing unit 550 of FIG. 5, or any system or combination of the systems depicted in the Figures described herein, such as in conjunction with a time frame 600 of FIG. 6. The operations described in blocks 708-728 may also be stored as computer-executable instructions in a computer-readable medium.

Example method 700 may begin with block 708 that starts execution of the power amplifier noise compensation method and includes providing an input signal to be transmitted at a transmitter to a receiver via a path that couples the transmitter and the receiver. In the example, a transmitter and receiver may be included in wireless transceiver with paths from respective transmitting and receiving antennas, such as the electronic device 200. In context of FIG. 2, the signal to be transmitted T(n) 247 is provided to the transmitting antenna 250 via a switch 245. The transmitter path to the transmitting antenna 250 includes a path through the switch 245 for transmission of any signal to be transmitted. That same amplified signal to be transmitted T(n) 247 is provided to the receiver path via the switch 245, when the switch 245 is activated, as the signal X(n) 249. Block 708 may be followed by block 712, such that the method further includes providing, after processing through the receiver, a feedback signal based on the input signal to be transmitted to the coefficient calculator. In the context of FIG. 2, after processing of the signal X(n) 249, a feedback signal X(n) 277 is provided to the coefficient calculator 280.

Block 712 may be followed by block 716, such that the method further includes calculating an error representative of power amplifier noise based partly on the input signal to be transmitted and the feedback signal to generate coefficient data associated with the power amplifier noise. For example, various ALUs, such as multiplication units, in an integrated circuit may be configured to operate as the circuitry of FIG. 5, thereby combining the input signal to be transmitted and the feedback signal to generate and/or update a plurality of coefficients to be utilized in DPD filter as a model for at least partially compensating non-linear power amplifier noise. Block 716 may be followed by block 720, such that the method further includes deactivating the path that couples the transmitter and the receiver. In the context of FIG. 2, the switch 245 deactivates the path that provides between the transmitter and the receiver that provides the amplified signal to be transmitted X(n) 249 to wireless receiver path. In deactivating that path, the wireless receiver portion of a wireless transceiver may receive wireless transmission signals, thereby providing for efficient TDD configured radio frames.

Block 720 may be followed by a block 724, such that the method further includes receiving, at a radio frequency (RF) antenna, an additional signal to be transmitted. With the switch 245 deactivated, the electronic device 200 utilizes the LNA 260, the mixer 263 in conjunction with the provided local oscillating signal from the local oscillator 290, the intermediate frequency (IF) filter 265, the analog-to-digital converter 270, and the numerically controlled oscillator (NCO) 275 to receive and process one or more received signals R(n) 257. Block 724 may be followed by block 728 that ends the example method 700.

The blocks included in the described example method 700 is for illustration purposes. In some embodiments, these blocks may be performed in a different order. In some other embodiments, various blocks may be eliminated. In still other embodiments, various blocks may be divided into additional blocks, supplemented with other blocks, or combined together into fewer blocks. Other variations of these specific blocks are contemplated, including changes in the order of the blocks, changes in the content of the blocks being split or combined into other blocks, etc.

Figure 8:
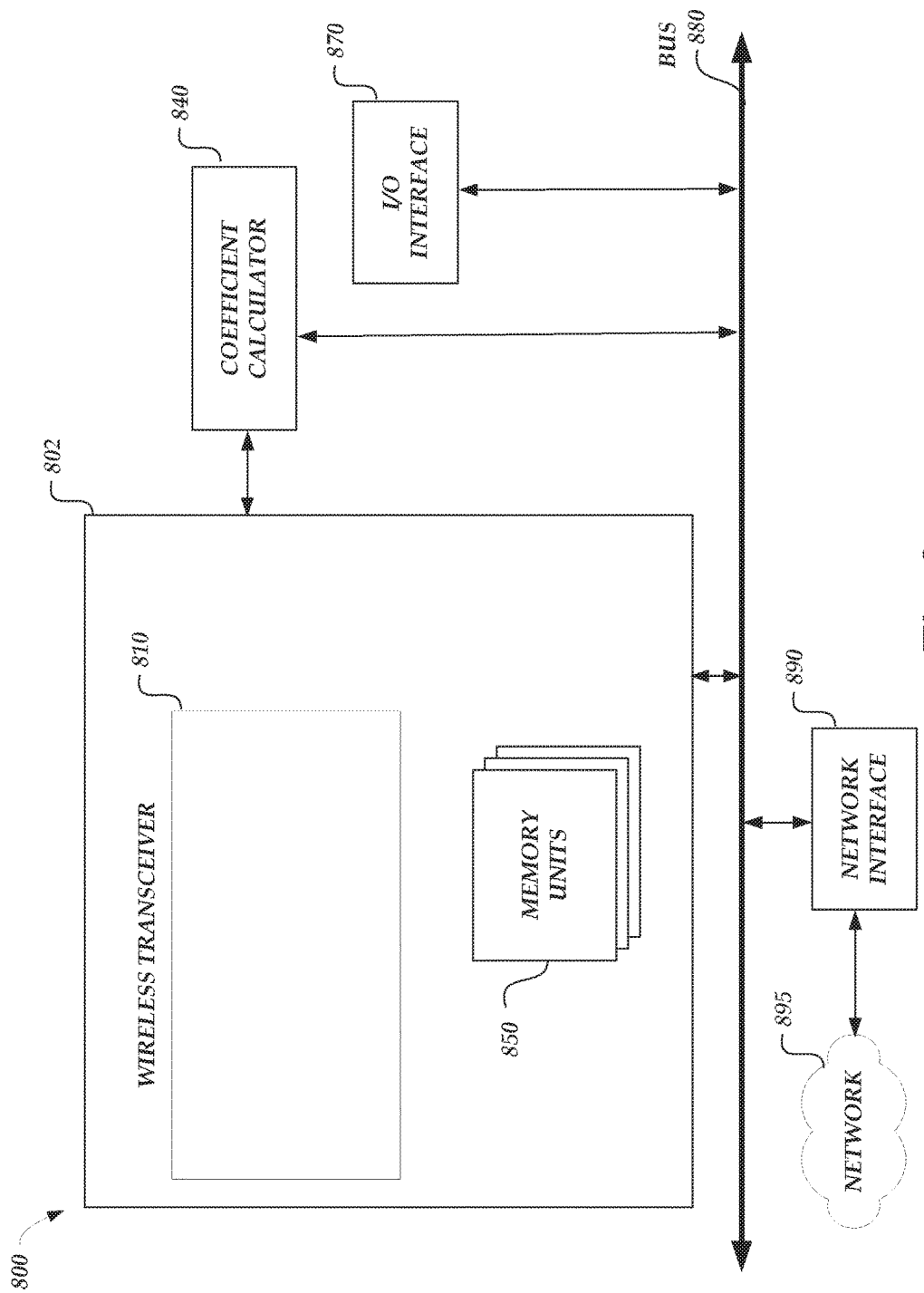
FIG. 8 is a block diagram of a computing device arranged in accordance with examples described herein.

FIG. 8 is a block diagram of an electronic device 800 arranged in accordance with examples described herein. The electronic device 800 may operate in accordance with any example described herein, such as electronic device 102, 110 of FIG. 1, electronic device 200 of FIG. 2, processing unit 550 of FIG. 5, or any system or combination of the systems depicted in the Figures described herein, such as in conjunction with a time frame 600 of FIG. 6. The electronic device 800 may be implemented in a smartphone, a wearable electronic device, a server, a computer, an appliance, a vehicle, or any type of electronic device. The electronic device 800 includes a computing system 802, a coefficient calculator 840, an I/O interface 870, and a network interface 890 coupled to a network 895. The computing system 802 includes a wireless transceiver 810. The wireless transceiver may include a wireless transmitter and/or wireless receiver, such as wireless transmitter 300 and wireless receiver 400. Coefficient calculator 840 may include any type of microprocessor, central processing unit (CPU), an application specific integrated circuits (ASIC), a digital signal processor (DSP) implemented as part of a field-programmable gate array (FPGA), a system-on-chip (SoC), or other hardware to provide processing for device 800.

The computing system 802 includes memory units 850 (e.g., memory look-up unit), which may be non-transitory hardware readable medium including instructions, respectively, for calculating coefficient or be memory units for the retrieval, calculation, or storage of signals to be compensated based on calculated coefficient data. The coefficient calculator 840 may control the computing system 802 with control instructions that indicate when to execute such stored instructions for calculating coefficient or for the retrieval or storage of signals to be compensated based on calculated coefficient. Upon receiving such control instructions, the wireless transceiver 810 may execute such instructions. For example, such instructions may include a program that executes the method 700. Communications between the coefficient calculator 840, the I/O interface 870, and the network interface 890 are provided via an internal bus 880. The coefficient calculator 840 may receive control instructions from the I/O interface 870 or the network interface 890, such as instructions to calculate an autocorrelation matrix.

Bus 880 may include one or more physical buses, communication lines/interfaces, and/or point-to-point connections, such as Peripheral Component Interconnect (PCI) bus, a Gen-Z switch, a CCIX interface, or the like. The I/O interface 870 can include various user interfaces including video and/or audio interfaces for the user, such as a tablet display with a microphone. Network interface 890 communications with other electronic devices, such as electronic device 800 or a cloud-electronic server, over the network 895. For example, the network interface 890 may be a USB interface.

Figure 9:
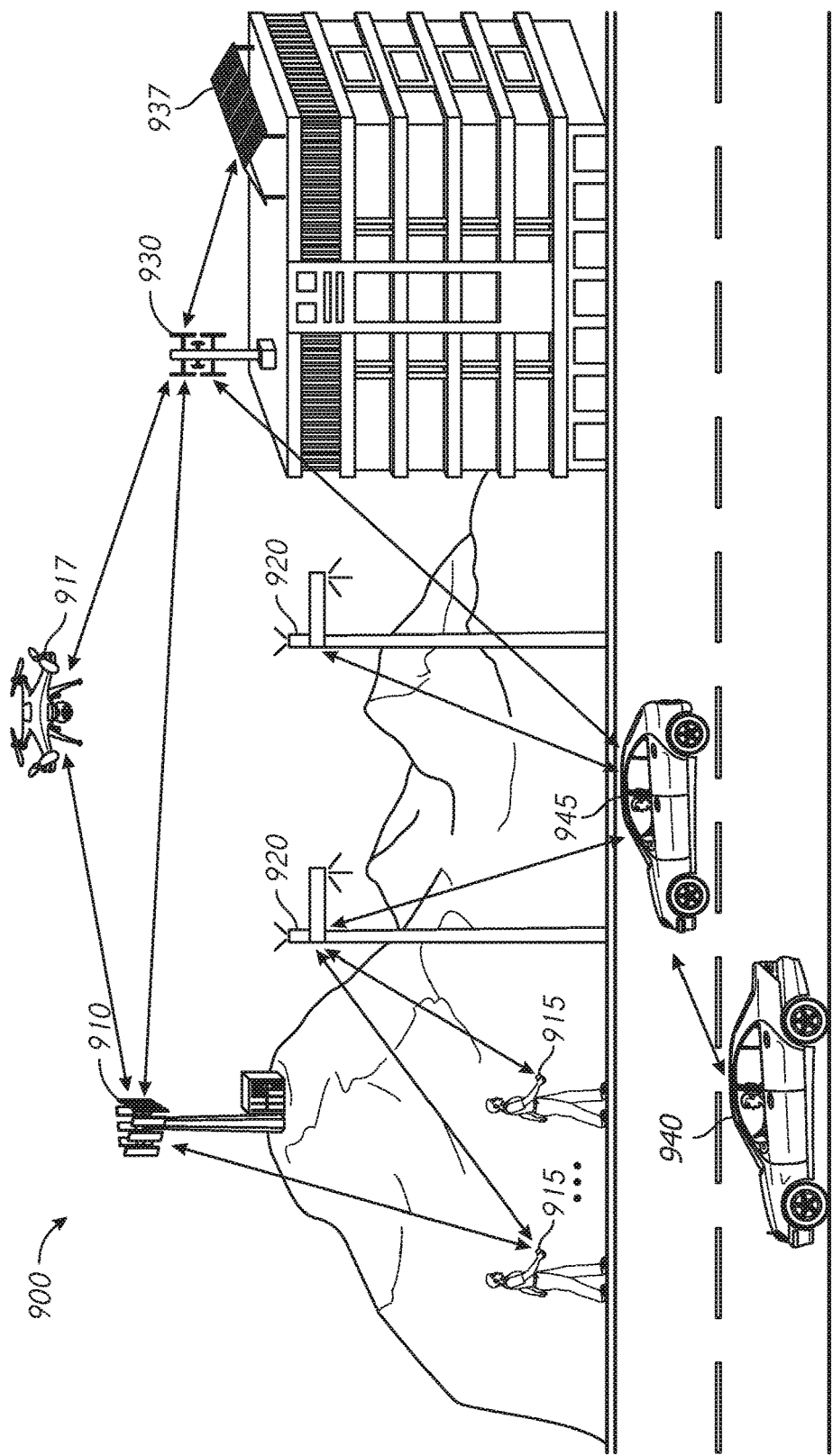
FIG. 9 is a schematic illustration of a wireless communications system arranged in accordance with aspects of the present disclosure.

FIG. 9 illustrates an example of a wireless communications system 900 in accordance with aspects of the present disclosure. The wireless communications system 900 includes a base station 910, a mobile device 915, a drone 917, a small cell 930, and vehicles 940, 945. The base station 910 and small cell 930 may be connected to a network that provides access to the Internet and traditional communication links. The system 900 may facilitate a wide-range of wireless communications connections in a 5G system that may include various frequency bands, including but not limited to: a sub-6 GHz band (e.g., 700 MHz communication frequency), mid-range communication bands (e.g., 2.4 GHz), mmWave bands (e.g., 24 GHz), and a NR band (e.g., 3.5 GHz).

Additionally or alternatively, the wireless communications connections may support various modulation schemes, including but not limited to: filter bank multi-carrier (FBMC), the generalized frequency division multiplexing (GFDM), universal filtered multi-carrier (UFMC) transmission, bi-orthogonal frequency division multiplexing (BFDM), sparse code multiple access (SCMA), non-orthogonal multiple access (NOMA), multi-user shared access (MUSA), and faster-than-Nyquist (FTN) signaling with time-frequency packing. Such frequency bands and modulation techniques may be a part of a standards framework, such as Long Term Evolution (LTE) (e.g., 1.8 GHz band) or other technical specification published by an organization like 3GPP or IEEE, which may include various specifications for subcarrier frequency ranges, a number of subcarriers, uplink/downlink transmission speeds, TDD/FDD, and/or other aspects of wireless communication protocols.

The system 900 may depict aspects of a radio access network (RAN), and system 900 may be in communication with or include a core network (not shown). The core network may include one or more serving gateways, mobility management entities, home subscriber servers, and packet data gateways. The core network may facilitate user and control plane links to mobile devices via the RAN, and it may be an interface to an external network (e.g., the Internet). Base stations 910, communication devices 920, and small cells 930 may be coupled with the core network or with one another, or both, via wired or wireless backhaul links (e.g., S1 interface, X2 interface, etc.).

The system 900 may provide communication links connected to devices or "things," such as sensor devices, e.g., solar cells 937, to provide an Internet of Things ("IoT") framework. Connected things within the IoT may operate within frequency bands licensed to and controlled by cellular network service providers, or such devices or things may. Such frequency bands and operation may be referred to as narrowband IoT (NB-IoT) because the frequency bands allocated for IoT operation may be small or narrow relative to the overall system bandwidth. Frequency bands allocated for NB-IoT may have bandwidths of, 50, 100, 150, or 200 kHz, for example.

Additionally or alternatively, the IoT may include devices or things operating at different frequencies than traditional cellular technology to facilitate use of the wireless spectrum. For example, an IoT framework may allow multiple devices in system 900 to operate at a sub-6 GHz band or other industrial, scientific, and medical (ISM) radio bands where devices may operate on a shared spectrum for unlicensed uses. The sub-6 GHz band may also be characterized as and may also be characterized as an NB-IoT band. For example, in operating at low frequency ranges, devices providing sensor data for "things," such as solar cells 937, may utilize less energy, resulting in power-efficiency and may utilize less complex signaling frameworks, such that devices may transmit asynchronously on that sub-6 GHz band. The sub-6 GHz band may support a wide variety of uses case, including the communication of sensor data from various sensors devices. Examples of sensor devices include sensors for detecting energy, heat, light, vibration, biological signals (e.g., pulse, EEG, EKG, heart rate, respiratory rate, blood pressure), distance, speed, acceleration, or combinations thereof. Sensor devices may be deployed on buildings, individuals, and/or in other locations in the environment. The sensor devices may communicate with one another and with computing systems which may aggregate and/or analyze the data provided from one or multiple sensor devices in the environment.

In such a 5G framework, devices may perform functionalities performed by base stations in other mobile networks (e.g., UMTS or LTE), such as forming a connection or managing mobility operations between nodes (e.g., handoff or reselection). For example, mobile device 915 may receive sensor data from the user utilizing the mobile device 915, such as blood pressure data, and may transmit that sensor data on a narrowband IoT frequency band to base station 910. In such an example, some parameters for the determination by the mobile device 915 may include availability of licensed spectrum, availability of unlicensed spectrum, and/or time-sensitive nature of sensor data. Continuing in the example, mobile device 915 may transmit the blood pressure data because a narrowband IoT band is available and can transmit the sensor data quickly, identifying a time-sensitive component to the blood pressure (e.g., if the blood pressure measurement is dangerously high or low, such as systolic blood pressure is three standard deviations from norm).

Additionally or alternatively, mobile device 915 may form device-to-device (D2D) connections with other mobile devices or other elements of the system 900. For example, the mobile device 915 may form RFID, WiFi, MultiFire, Bluetooth, or Zigbee connections with other devices, including communication device 920 or vehicle 945. In some examples, D2D connections may be made using licensed spectrum bands, and such connections may be managed by a cellular network or service provider. Accordingly, while the above example was described in the context of narrowband IoT, it can be appreciated that other device-to-device connections may be utilized by mobile device 915 to provide information (e.g., sensor data) collected on different frequency bands than a frequency band determined by mobile device 915 for transmission of that information.

Moreover, some communication devices may facilitate ad-hoc networks, for example, a network being formed with communication devices 920 attached to stationary objects and the vehicles 940, 945, without a traditional connection to a base station 910 and/or a core network necessarily being formed. Other stationary objects may be used to support communication devices 920, such as, but not limited to, trees, plants, posts, buildings, blimps, dirigibles, balloons, street signs, mailboxes, or combinations thereof. In such a system 900, communication devices 920 and small cell 930 (e.g., a small cell, femtocell, WLAN access point, cellular hotspot, etc.) may be mounted upon or adhered to another structure, such as lampposts and buildings to facilitate the formation of ad-hoc networks and other IoT-based networks. Such networks may operate at different frequency bands than existing technologies, such as mobile device 915 communicating with base station 910 on a cellular communication band.

The communication devices 920 may form wireless networks, operating in either a hierarchal or ad-hoc network fashion, depending, in part, on the connection to another element of the system 900. For example, the communication devices 920 may utilize a 700 MHz communication frequency to form a connection with the mobile device 915 in an unlicensed spectrum, while utilizing a licensed spectrum communication frequency to form another connection with the vehicle 945. Communication devices 920 may communicate with vehicle 945 on a licensed spectrum to provide direct access for time-sensitive data, for example, data for an autonomous driving capability of the vehicle 945 on a 5.9 GHz band of Dedicated Short Range Communications (DSRC).

Vehicles 940 and 945 may form an ad-hoc network at a different frequency band than the connection between the communication device 920 and the vehicle 945. For example, for a high bandwidth connection to provide time-sensitive data between vehicles 940, 945, a 24 GHz mmWave band may be utilized for transmissions of data between vehicles 940, 945. For example, vehicles 940, 945 may share real-time directional and navigation data with each other over the connection while the vehicles 940, 945 pass each other across a narrow intersection line. Each vehicle 940, 945 may be tracking the intersection line and providing image data to an image processing algorithm to facilitate autonomous navigation of each vehicle while each travels along the intersection line. In some examples, this real-time data may also be substantially simultaneously shared over an exclusive, licensed spectrum connection between the communication device 920 and the vehicle 945, for example, for processing of image data received at both vehicle 945 and vehicle 940, as transmitted by the vehicle 940 to vehicle 945 over the 24 GHz mmWave band. While shown as automobiles in FIG. 9, other vehicles may be used including, but not limited to, aircraft, spacecraft, balloons, blimps, dirigibles, trains, submarines, boats, ferries, cruise ships, helicopters, motorcycles, bicycles, drones, or combinations thereof.

While described in the context of a 24 GHz mmWave band, it can be appreciated that connections may be formed in the system 900 in other mmWave bands or other frequency bands, such as 28 GHz, 37 GHz, 38 GHz, 39 GHz, which may be licensed or unlicensed bands. In some cases, vehicles 940, 945 may share the frequency band that they are communicating on with other vehicles in a different network. For example, a fleet of vehicles may pass vehicle 940 and, temporarily, share the 24 GHz mmWave band to form connections among that fleet, in addition to the 24 GHz mmWave connection between vehicles 940, 945. As another example, communication device 920 may substantially simultaneously maintain a 700 MHz connection with the mobile device 915 operated by a user (e.g., a pedestrian walking along the street) to provide information regarding a location of the user to the vehicle 945 over the 5.9 GHz band. In providing such information, communication device 920 may leverage antenna diversity schemes as part of a massive MIMO framework to facilitate time-sensitive, separate connections with both the mobile device 915 and the vehicle 945. A massive MIMO framework may involve a transmitting and/or receiving devices with a large number of antennas (e.g., 12, 20, 64, 128, etc.), which may facilitate precise beamforming or spatial diversity unattainable with devices operating with fewer antennas according to legacy protocols (e.g., WiFi or LTE).

The base station 910 and small cell 930 may wirelessly communicate with devices in the system 900 or other communication-capable devices in the system 900 having at the least a sensor wireless network, such as solar cells 937 that may operate on an active/sleep cycle, and/or one or more other sensor devices. The base station 910 may provide wireless communications coverage for devices that enter its coverages area, such as the mobile device 915 and the drone 917. The small cell 930 may provide wireless communications coverage for devices that enter its coverage area, such as near the building that the small cell 930 is mounted upon, such as vehicle 945 and drone 917.

Generally, a small cell 930 may be referred to as a small cell and provide coverage for a local geographic region, for example, coverage of 200 meters or less in some examples. This may contrasted with at macrocell, which may provide coverage over a wide or large area on the order of several square miles or kilometers. In some examples, a small cell 930 may be deployed (e.g., mounted on a building) within some coverage areas of a base station 910 (e.g., a macrocell) where wireless communications traffic may be dense according to a traffic analysis of that coverage area. For example, a small cell 930 may be deployed on the building in FIG. 9 in the coverage area of the base station 910 if the base station 910 generally receives and/or transmits a higher amount of wireless communication transmissions than other coverage areas of that base station 910. A base station 910 may be deployed in a geographic area to provide wireless coverage for portions of that geographic area. As wireless communications traffic becomes more dense, additional base stations 910 may be deployed in certain areas, which may alter the coverage area of an existing base station 910, or other support stations may be deployed, such as a small cell 930.

Small cell 930 may be a femtocell, which may provide coverage for an area smaller than a small cell (e.g., 100 meters or less in some examples (e.g., one story of a building)).

While base station 910 and small cell 930 may provide communication coverage for a portion of the geographical area surrounding their respective areas, both may change aspects of their coverage to facilitate faster wireless connections for certain devices. For example, the small cell 930 may primarily provide coverage for devices surrounding or in the building upon which the small cell 930 is mounted. However, the small cell 930 may also detect that a device has entered is coverage area and adjust its coverage area to facilitate a faster connection to that device.

For example, a small cell 930 may support a massive MIMO connection with the drone 917, which may also be referred to as an unmanned aerial vehicle (UAV), and, when the vehicle 945 enters it coverage area, the small cell 930 adjusts some antennas to point directionally in a direction of the vehicle 945, rather than the drone 917, to facilitate a massive MIMO connection with the vehicle, in addition to the drone 917. In adjusting some of the antennas, the small cell 930 may not support as fast as a connection to the drone 917 at a certain frequency, as it had before the adjustment. For example, the small cell 930 may be communicating with the drone 917 on a first frequency of various possible frequencies in a 4G LTE band of 1.8 GHz. However, the drone 917 may also request a connection at a different frequency with another device (e.g., base station 910) in its coverage area that may facilitate a similar connection as described with reference to the small cell 930, or a different (e.g., faster, more reliable) connection with the base station 910, for example, at a 3.5 GHz frequency in the 5G NR band. In some examples, drone 917 may serve as a movable or aerial base station. Accordingly, the system 900 may enhance existing communication links in compensating, at least partially, non-linear power amplifier devices for devices that include power amplifiers, for example, in both the 4GE LTE and 5G NR bands.

The wireless communications system 900 may include devices such as base station 910, communication device 920, and small cell 930 that may support several connections at varying frequencies to devices in the system 900, while also at least partially compensating for non-linear power amplifier noise utilizing coefficient calculators, such as coefficient calculator 280. Such devices may operate in a hierarchal mode or an ad-hoc mode with other devices in the network of system 900. While described in the context of a base station 910, communication device 920, and small cell 930, it can be appreciated that other devices that can support several connections with devices in the network, while also at least partially compensating for non-linear power amplifier noise utilizing coefficient calculators, may be included in system 900, including but not limited to: macrocells, femtocells, routers, satellites, and RFID detectors.

In various examples, the elements of wireless communication system 900, such as base station 910, a mobile device 915, a drone 917, communication device 920, a small cell 930, and vehicles 940, 945, may be implemented as an electronic device described herein that at least partially compensate for non-linear power amplifier noise utilizing coefficient calculators. For example, the communication device 920 may be implemented as electronic devices described herein, such as electronic device 102, 110 of FIG. 1, electronic device 200 of FIG. 2, processing unit 550 of FIG. 5, or any system or combination of the systems depicted in the Figures described herein, such as in conjunction with a time frame 600 of FIG. 6.

Figure 10:
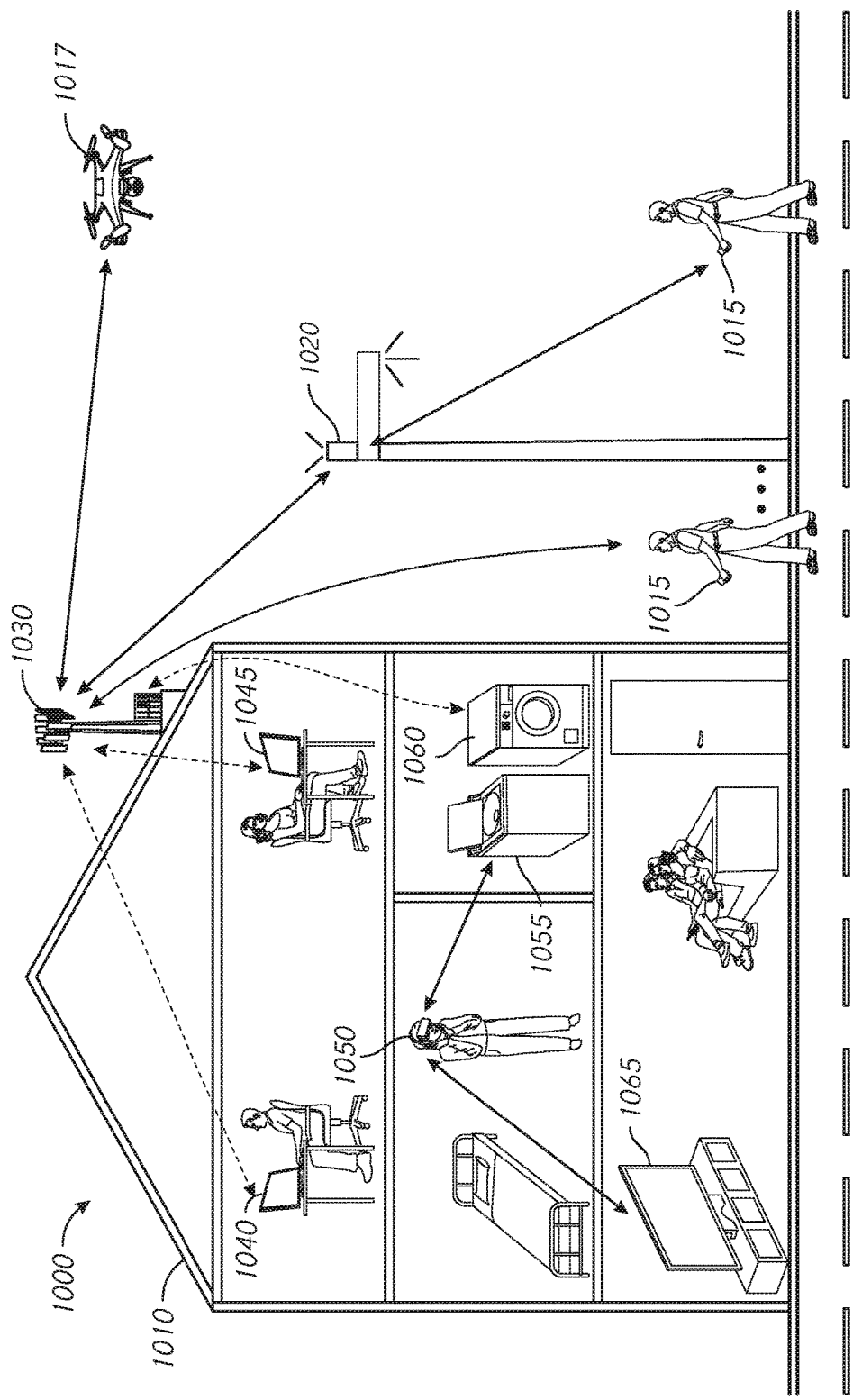
FIG. 10 is a schematic illustration of a wireless communications system arranged in accordance with aspects of the present disclosure.

FIG. 10 illustrates an example of a wireless communications system 1000 in accordance with aspects of the present disclosure. The wireless communications system 1000 includes a mobile device 1015, a drone 1017, a communication device 1020, and a small cell 1030. A building 1010 also includes devices of the wireless communication system 1000 that may be configured to communicate with other elements in the building 1010 or the small cell 1030. The building 1010 includes networked workstations 1040, 1045, virtual reality device 1050, IoT devices 1055, 1060, and networked entertainment device 1065. In the depicted system 1000, IoT devices 1055, 1060 may be a washer and dryer, respectively, for residential use, being controlled by the virtual reality device 1050. Accordingly, while the user of the virtual reality device 1050 may be in different room of the building 1010, the user may control an operation of the IoT device 1055, such as configuring a washing machine setting. Virtual reality device 1050 may also control the networked entertainment device 1065. For example, virtual reality device 1050 may broadcast a virtual game being played by a user of the virtual reality device 1050 onto a display of the networked entertainment device 1065.

The small cell 1030 or any of the devices of building 1010 may be connected to a network that provides access to the Internet and traditional communication links. Like the system 900, the system 1000 may facilitate a wide-range of wireless communications connections in a 5G system that may include various frequency bands, including but not limited to: a sub-6 GHz band (e.g., 700 MHz communication frequency), mid-range communication bands (e.g., 2.4 GHz), mmWave bands (e.g., 24 GHz), or any other bands, such as a 1 MHz, 5 MHz, 10 MHz, 20 MHz band. Additionally or alternatively, the wireless communications connections may support various modulation schemes as described above with reference to system 900. System 1000 may operate and be configured to communicate analogously to system 900. Accordingly, similarly numbered elements of system 1000 and system 900 may be configured in an analogous way, such as communication device 920 to communication device 1020, small cell 930 to small cell 1030, etc.

Like the system 900, where elements of system 900 are configured to form independent hierarchal or ad-hoc networks, communication device 1020 may form a hierarchal network with small cell 1030 and mobile device 1015, while an additional ad-hoc network may be formed among the small cell 1030 network that includes drone 1017 and some of the devices of the building 1010, such as networked workstations 1040, 1045 and IoT devices 1055, 1060.

Devices in communication system 1000 may also form (D2D) connections with other mobile devices or other elements of the system 1000. For example, the virtual reality device 1050 may form a narrowband IoT connections with other devices, including IoT device 1055 and networked entertainment device 1065. As described above, in some examples, D2D connections may be made using licensed spectrum bands, and such connections may be managed by a cellular network or service provider. Accordingly, while the above example was described in the context of a narrowband IoT, it can be appreciated that other device-to-device connections may be utilized by virtual reality device 1050.

In various examples, the elements of wireless communication system 1000, such as the mobile device 1015, the drone 1017, the communication device 1020, and the small cell 1030, the networked workstations 1040, 1045, the virtual reality device 1050, the IoT devices 1055, 1060, and the networked entertainment device 1065, may be implemented as electronic devices described herein that at least partially compensate for non-linear power amplifier noise utilizing coefficient calculators. For example, the communication device 1020 may be implemented as electronic devices described herein, such as electronic device 102, 110 of FIG. 1, electronic device 200 of FIG. 2, processing unit 550 of FIG. 5, or any system or combination of the systems depicted in the Figures described herein, such as in conjunction with a time frame 600 of FIG. 6.

Certain details are set forth above to provide a sufficient understanding of described examples. However, it will be clear to one skilled in the art that examples may be practiced without various of these particular details. The description herein, in connection with the appended drawings, describes example configurations and does not represent all the examples that may be implemented or that are within the scope of the claims. The terms "exemplary" and "example" as may be used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Techniques described herein may be used for various wireless communications systems, which may include multiple access cellular communication systems, and which may employ code division multiple access (CDMA), time division multiple access (TDMA), frequency division multiple access (FDMA), orthogonal frequency division multiple access (OFDMA), or single carrier frequency division multiple access (SC-FDMA), or any combination of such techniques. Some of these techniques have been adopted in or relate to standardized wireless communication protocols by organizations such as Third Generation Partnership Project (3GPP), Third Generation Partnership Project 2 (3GPP2) and IEEE. These wireless standards include Ultra Mobile Broadband (UMB), Universal Mobile Telecommunications System (UMTS), Long Term Evolution (LTE), LTE-Advanced (LTE-A), LTE-A Pro, New Radio (NR), IEEE 802.11 (WiFi), and IEEE 802.16 (WiMAX), among others.

The terms "5G" or "5G communications system" may refer to systems that operate according to standardized protocols developed or discussed after, for example, LTE Releases 13 or 14 or WiMAX 802.16e-2005 by their respective sponsoring organizations. The features described herein may be employed in systems configured according to other generations of wireless communication systems, including those configured according to the standards described above.

The various illustrative blocks and modules described in connection with the disclosure herein may be implemented or performed with a general-purpose processor, a digital signal processor (DSP), an application-specific integrated circuit (ASIC), a field-programmable gate array (FPGA), or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), or optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Combinations of the above are also included within the scope of computer-readable media.

Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

Also, as used herein, including in the claims. "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing it will be appreciated that, although specific examples have been described herein for purposes of illustration, various modifications may be made while remaining with the scope of the claimed technology. The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A system comprising:
    a communication device attached to a stationary object, the communication device comprising a plurality of antennas; and
    at least one vehicle configured to move past the communication device, the communication device and the at least one vehicle configured to form an ad hoc network to transmit communications from the communication device to the at least one vehicle;
    wherein the communication device comprises a switch configured to at least partially compensate non-linear power amplifier noise in the communications from the communication device to the at least one vehicle, the switch configured to selectively activate a first switch path that provides feedback from an output of a transmitter path to a pre-distortion (DPD) filter of the transmitter path via a receiver path, wherein the switch is further configured to receive a selection signal indicating whether the first switch path is to be activated, the selection signal based partly on a transmission time interval (TTI) of a time-division duplex (TDD) configured radio frame.

2. The system of claim 1, wherein the switch is further configured to selectively activate a second switch path that couples a transmitter of the communication device to at least one of the plurality of antennas, the transmitter path including the transmitter.

3. The system of claim 2, wherein the switch is further configured to selectively activate the first switch path by coupling the transmitter of the communication device to a receiver of the communication device, the receiver path including the receiver.

4. The system of claim 3, wherein the receiver is further configured to receive the communications from the transmitter and to process the communications as the feedback for the DPD filter.

5. The system of claim 1, wherein at least one antenna of the plurality of antennas is configured to operate in accordance with a wireless communication protocol that employs at least one of GFDM, FBMC, UFMC, DFDM, SCMA, NOMA, MUSA, or FTN, or any combination thereof.

6. The system of claim 1, wherein the TTI corresponds to a downlink transmission time interval (TTI) or an uplink transmission time interval (TTI).

7. The system of claim 6, wherein at least one antenna of the plurality of antennas is configured to transmit during the uplink TTI of the TDD configured radio frame.

8. The system of claim 1, wherein the communication device corresponds to at least one of a base station, small cell, mobile device, drone, communication device, a vehicle communication device, or a device configured to operate on a narrowband Internet of Things (IoT) frequency band.

9. The system of claim 1, wherein at least one antenna of the plurality of antennas is configured to transmit the communications between the communication device and the vehicle at a frequency corresponding to the 5G New Radio (NR) band.

10. A system comprising:
    a communication device attached to a stationary object, the communication device comprising a plurality of antennas;
    at least one vehicle configured to move past the communication device, the communication device and the at least one vehicle configured to form an ad hoc network to transmit communications from the communication device to the at least one vehicle;
    wherein the communication device comprises a switch configured to at least partially compensate non-linear power amplifier noise in the communications from the communication device to the at least one vehicle, the switch configured to selectively activate a first switch path that provides feedback from an output of a transmitter path to a pre-distortion (DPD) filter of the transmitter path via a receiver path;
    a plurality of wireless transceivers, each wireless transceiver configured to provide a respective signal of a plurality of signals to a respective antenna of the plurality of antennas, at least one of the plurality of wireless transceivers comprising the transmitter path and the receiver path; and
    a plurality of power amplifiers configured to receive respective signals and to amplify the signals to generate respective amplified signals of a plurality of amplified signals, each amplified signal including a portion of the non-linear power amplifier noise.

11. The system of claim 10, wherein each wireless transceiver comprises:
    a digital pre-distortion (DPD) filter configured to compensate a respective baseband signal;
    an digital-to-analog converter configured to convert the respective compensated baseband signal to a respective digital signal; and
    an intermediate frequency (IF) filter configured to provide a filtered digital signal to a respective power amplifier via a respective transmitter mixer.

12. The system of claim 11, wherein each wireless transceiver further comprises:
    a local oscillator configured to provide a local oscillator signal to the respective transmitter mixer of each wireless transceiver and a respective receiver mixer of each wireless transceiver.

13. A system comprising:
    a base station comprising:
        a transmit antenna;
        a transmitter configured to transmit a first communications signal via the transmit antenna, the transmitter comprising a digital pre-distortion (DPD) filter;
        a receive antenna;
        a receiver configured to receive a second communications signal via the receive antenna; and
        a switch configured to selectively activate a first switch path to couple the transmitter and the transmit antenna and a second switch path to couple the receiver and the transmitter to provide the first communications signal as feedback for the DPD filter to the receiver from the transmitter, wherein the switch is further configured to receive a selection signal indicating whether the second switch path is to be activated, the selection signal based partly on a transmission time interval (TTI) of a time-division duplex (TDD) configured radio frame; and at least one mobile device within a communications range of the base station, the base station and the at least one mobile device configured to form a hierarchical network for the base station to transmit and receive, respectively, the first and second communications signals.

14. The system of claim 13, wherein the switch is further configured to at least partially compensate non-linear power amplifier noise in the first communications signal from the base station to the at least one mobile device.

15. The system of claim 13, the receiver is further configured to receive the first communications signal from the transmitter and to process the first communications signal as the feedback for the DPD filter.

16. The system of claim 13, wherein the TTI corresponds to a downlink transmission time interval (TTI) or an uplink transmission time interval (TTI).

17. A system comprising:
a first device comprising:
a transmitter configured to transmit a first communication signal via a transmit antenna, the transmitter comprising a digital pre-distortion (DPD) filter;
a receiver configured to receive a second communication signal; and
a switch configured to selectively activate a first switch path to couple the transmitter and the transmit antenna and a second switch path to couple the receiver and the transmitter to provide at least a portion of the first communication signal as feedback for the DPD filter to the receiver from the transmitter, wherein the switch is further configured to receive a selection signal indicating whether the second switch path is to be activated, the selection signal based partly on a transmission time interval (TTI) of a time-division duplex (TDD) configured radio frame; and
a second device configured to communicate with the first device via a device-to-device (D2D) connection.

18. The system of claim 17, wherein the D2D connection comprises at least one of a RFID, WiFi, MultiFire, Bluetooth, or Zigbee connection.

19. The system of claim 17, the first device further comprising:
a coefficient calculator configured to receive the first communication signal when the second switch path is selectively activated and coupled between the transmitter and the receiver, the coefficient calculator configured to provide coefficient data to the DPD filter.

20. The system of claim 19, wherein the coefficient calculator comprising:
a network of processing elements configured to combine portions of the first communications signal into a plurality of sets of intermediate results, the first communications signal received from the receiver,
wherein the network of processing elements is further configured to sum each set of intermediate results to generate the coefficient data.

* * * * *